United States Patent
Yasuda et al.

(10) Patent No.: US 9,679,617 B2
(45) Date of Patent: Jun. 13, 2017

(54) AMPLIFIER

(71) Applicant: Kabushiki Kaisha Toshiba, Minato-ku (JP)

(72) Inventors: Yohei Yasuda, Yokohama (JP);
Hiromitsu Komai, Kamakura (JP);
Kensuke Yamamoto, Yokohama (JP);
Masaru Koyanagi, Tokyo (JP);
Yasuhiro Hirashima, Kawasaki (JP)

(73) Assignee: KABUSHIKI KAISHA TOSHIBA, Minato-ku (JP)

(*) Notice: Subject to any disclaimer, the term of this patent is extended or adjusted under 35 U.S.C. 154(b) by 0 days.

(21) Appl. No.: 15/181,528

(22) Filed: Jun. 14, 2016

(65) Prior Publication Data

US 2017/0084313 A1    Mar. 23, 2017

Related U.S. Application Data

(60) Provisional application No. 62/216,174, filed on Sep. 9, 2015.

(51) Int. Cl.
| | |
|---|---|
| *H03F 3/04* | (2006.01) |
| *G11C 7/06* | (2006.01) |
| *H03F 3/16* | (2006.01) |
| *G11C 7/22* | (2006.01) |

(52) U.S. Cl.
CPC ............ *G11C 7/06* (2013.01); *G11C 7/22* (2013.01); *H03F 3/16* (2013.01)

(58) Field of Classification Search
CPC .................................. G11C 7/06; H03F 3/04
USPC .................................................. 330/288, 257
See application file for complete search history.

(56) References Cited

U.S. PATENT DOCUMENTS

| | | | | |
|---|---|---|---|---|
| 5,194,762 A | | 3/1993 | Hara et al. | |
| 5,936,873 A | * | 8/1999 | Kongetira | G11C 7/062 365/203 |
| 5,982,690 A | * | 11/1999 | Austin | G11C 7/065 327/51 |
| 6,292,028 B1 | * | 9/2001 | Tomita | H04L 25/0272 326/30 |

(Continued)

FOREIGN PATENT DOCUMENTS

| | | |
|---|---|---|
| JP | 2-260196 | 10/1990 |
| JP | 7-192474 | 7/1995 |

(Continued)

*Primary Examiner* — Patricia T Nguyen
(74) *Attorney, Agent, or Firm* — Oblon, McClelland, Maier & Neustadt, L.L.P.

(57) ABSTRACT

According to one embodiment, an amplifier includes a first inverter which inverts and delays a first signal to generate a second signal. A second inverter inverts and delays a third signal to generate a fourth signal. A first transistor includes a gate electrode supplied with the second signal. A second transistor includes a gate electrode supplied with the fourth signal. An output terminal is coupled to one terminal of the second transistor and outputs a fifth signal. A third inverter inverts and delays the fifth signal to generate a sixth signal. A first discharge circuit discharges one terminal of the first transistor and the one terminal of the second transistor based on the first, sixth, or fourth signal, and includes one terminal coupled to the other terminal of each of the first and second transistors.

20 Claims, 15 Drawing Sheets

(56) References Cited

U.S. PATENT DOCUMENTS

| | | | |
|---|---|---|---|
| 2002/0008562 A1* | 1/2002 | Kokubun | H03F 3/45753 327/307 |
| 2002/0036317 A1 | 3/2002 | Matsui et al. | |
| 2007/0189085 A1* | 8/2007 | Bang | G11C 5/147 365/189.09 |
| 2009/0121751 A1* | 5/2009 | Bach | H03K 19/01852 327/108 |
| 2009/0267128 A1 | 10/2009 | Maejima | |
| 2009/0268522 A1 | 10/2009 | Maejima | |
| 2009/0316494 A1 | 12/2009 | Uehara et al. | |
| 2010/0034023 A1 | 2/2010 | Shingu et al. | |
| 2011/0241635 A1* | 10/2011 | Yamahira | H03K 19/00361 323/271 |
| 2011/0284946 A1 | 11/2011 | Kiyotoshi | |
| 2012/0201083 A1 | 8/2012 | Fujiu | |
| 2013/0141971 A1 | 6/2013 | Hosono | |

FOREIGN PATENT DOCUMENTS

| | | |
|---|---|---|
| JP | 2000-207888 | 7/2000 |
| JP | 2014-187416 | 10/2014 |

\* cited by examiner

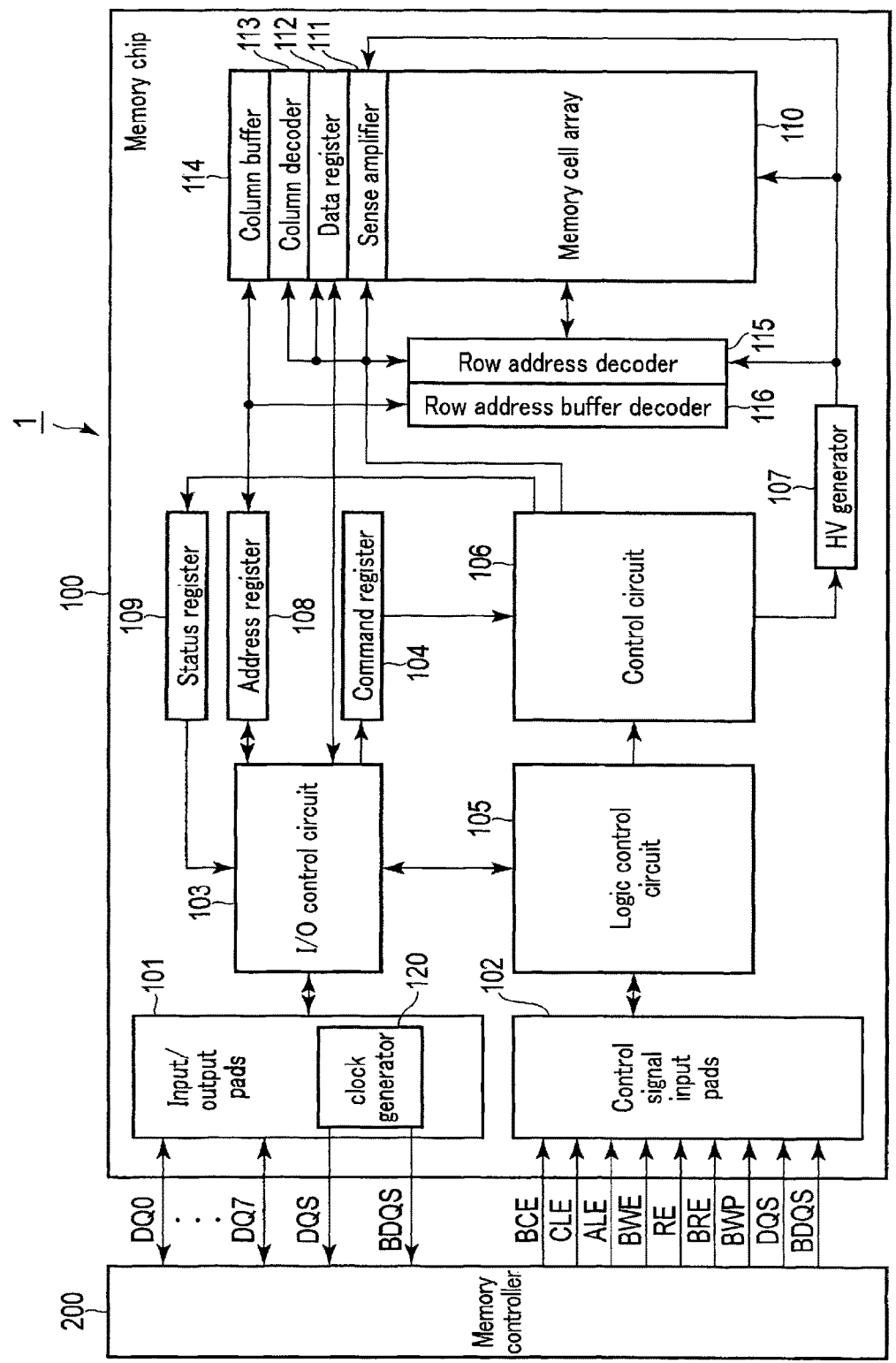
F I G. 1

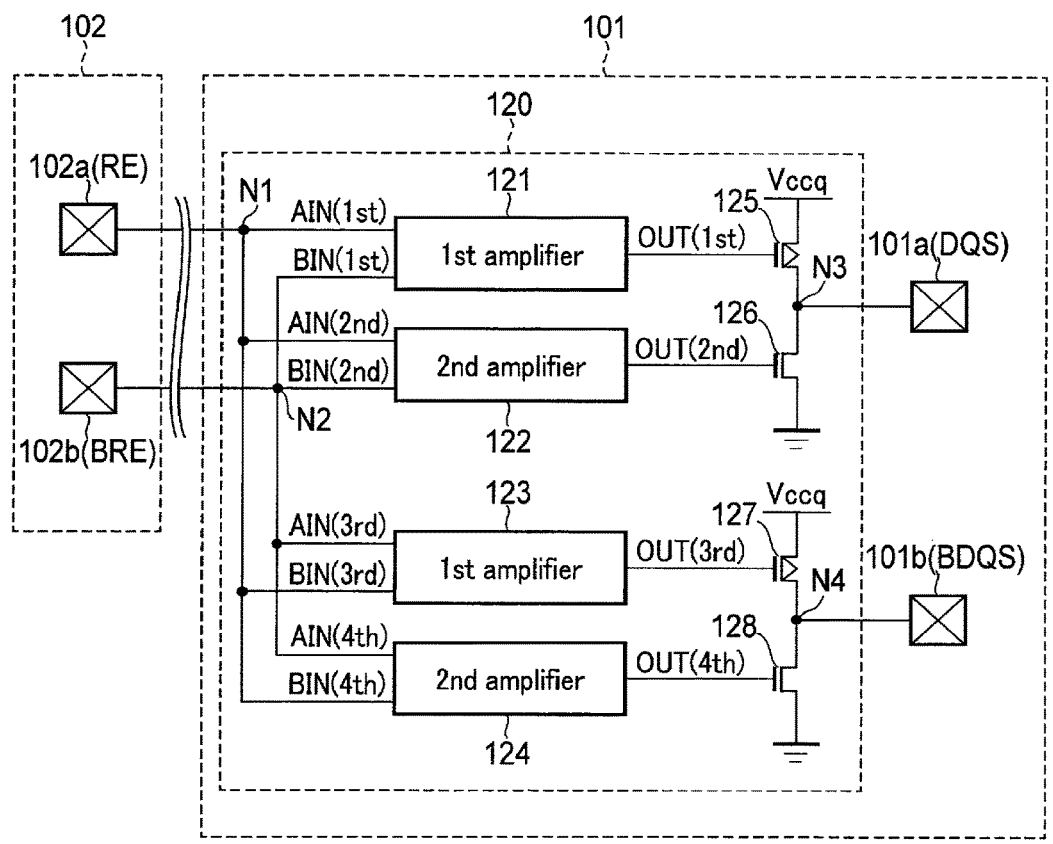
F I G. 2

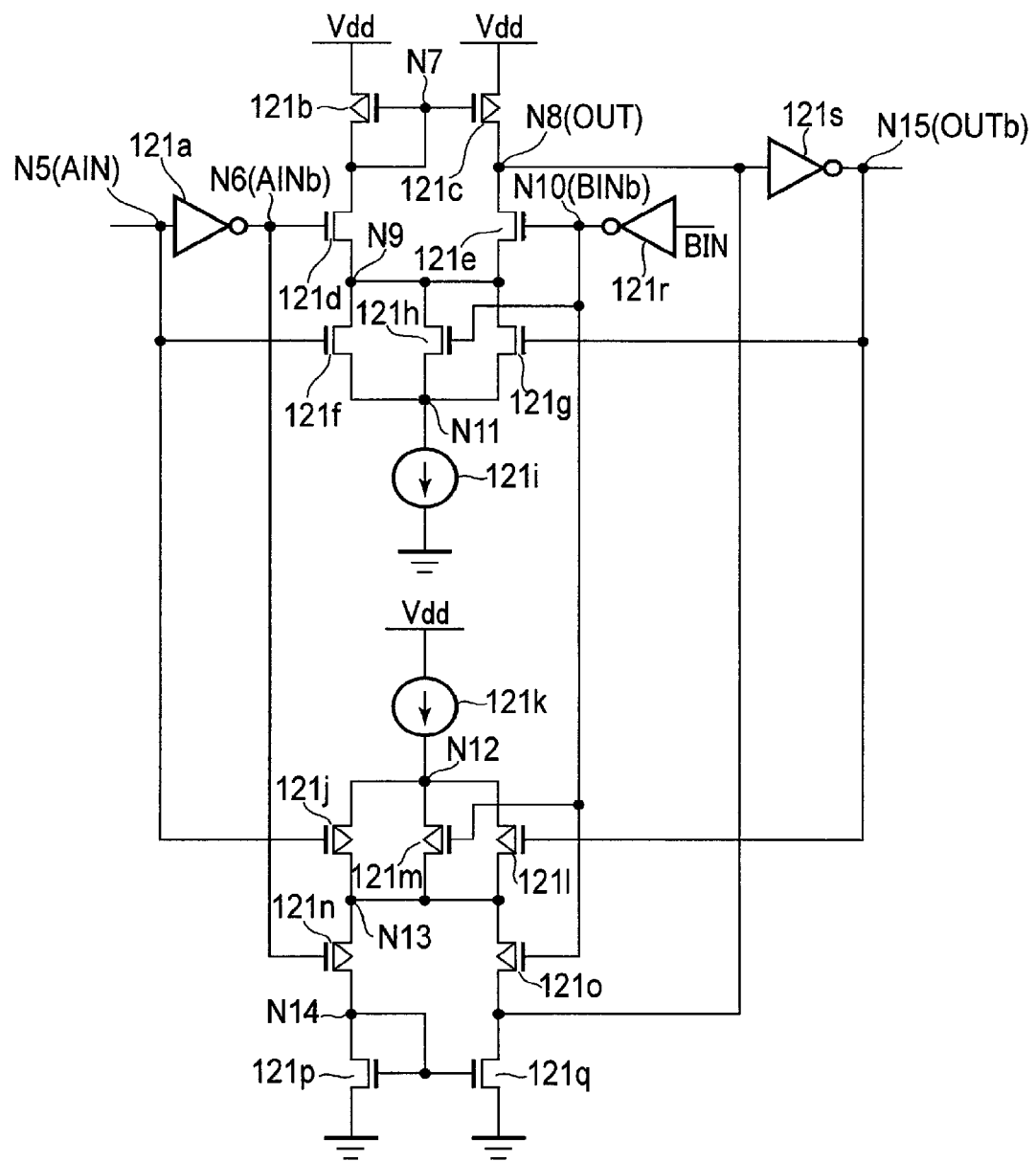
F I G. 3

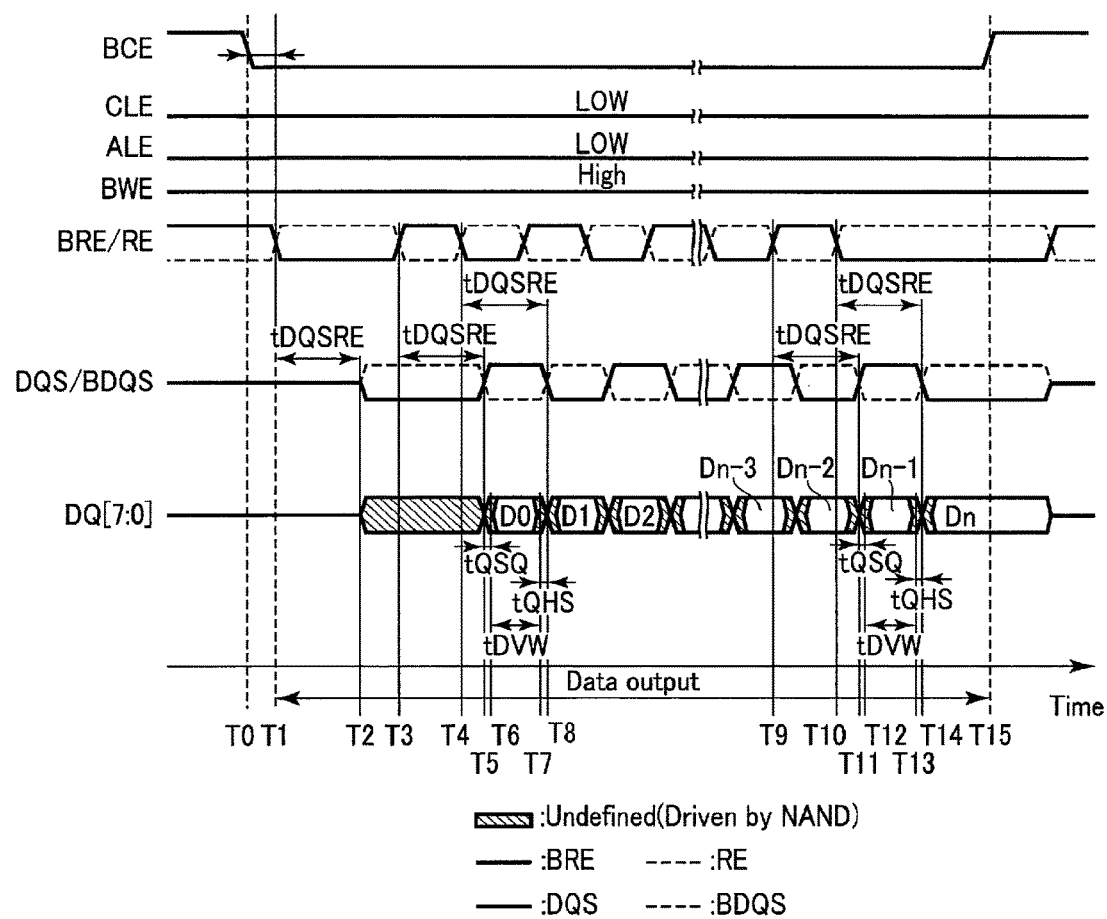
F I G. 4

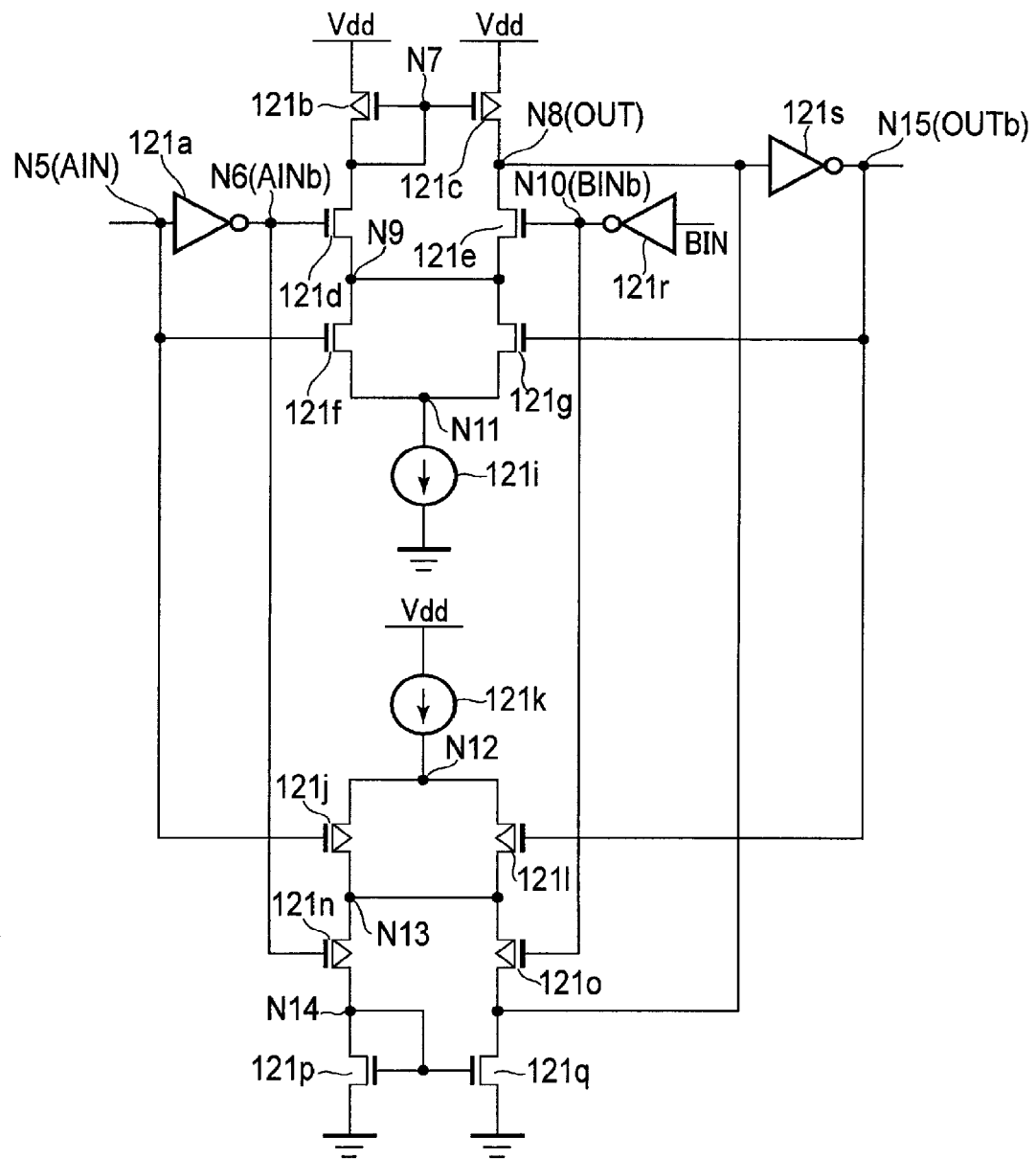
F I G. 6

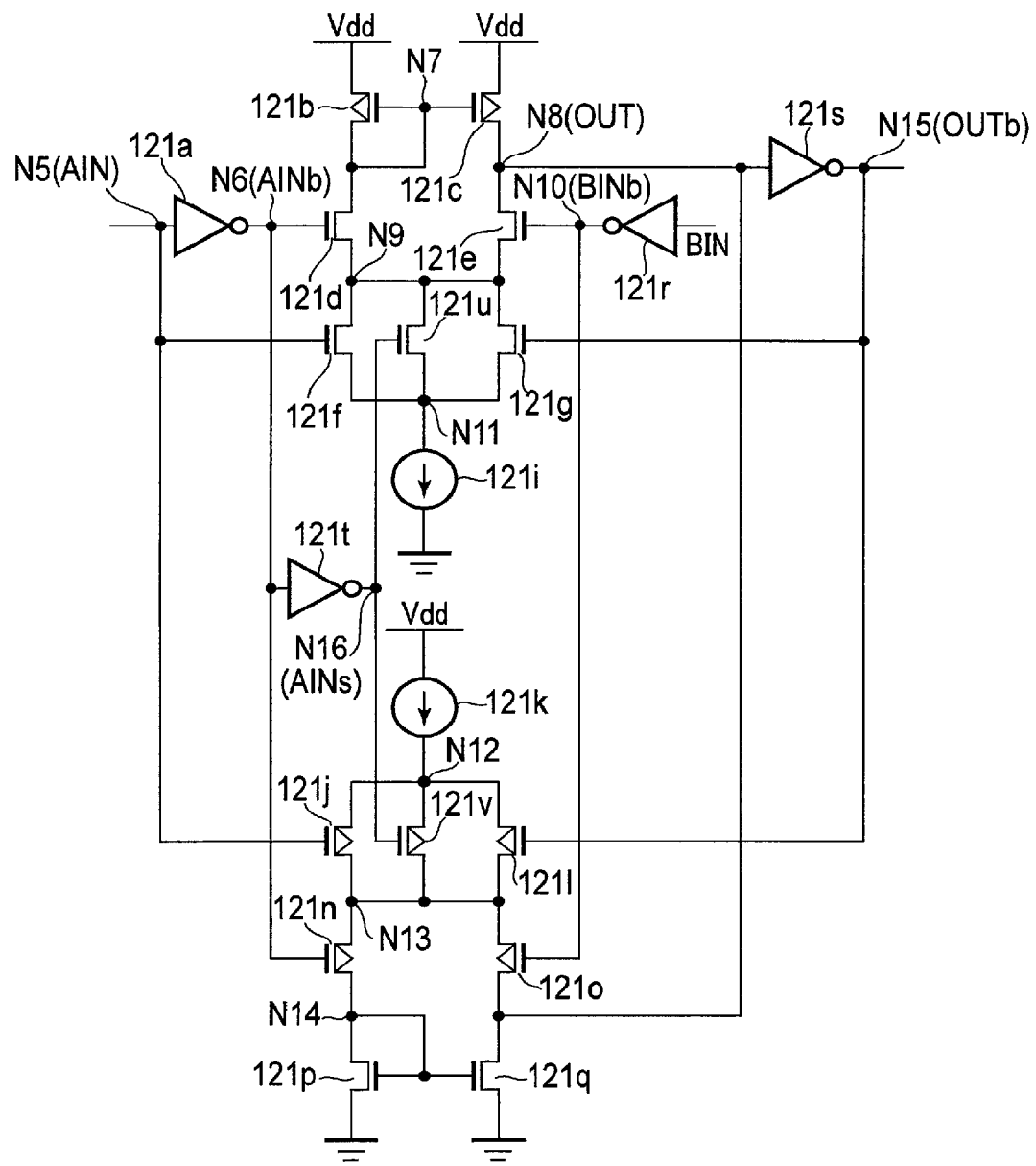
F I G. 8

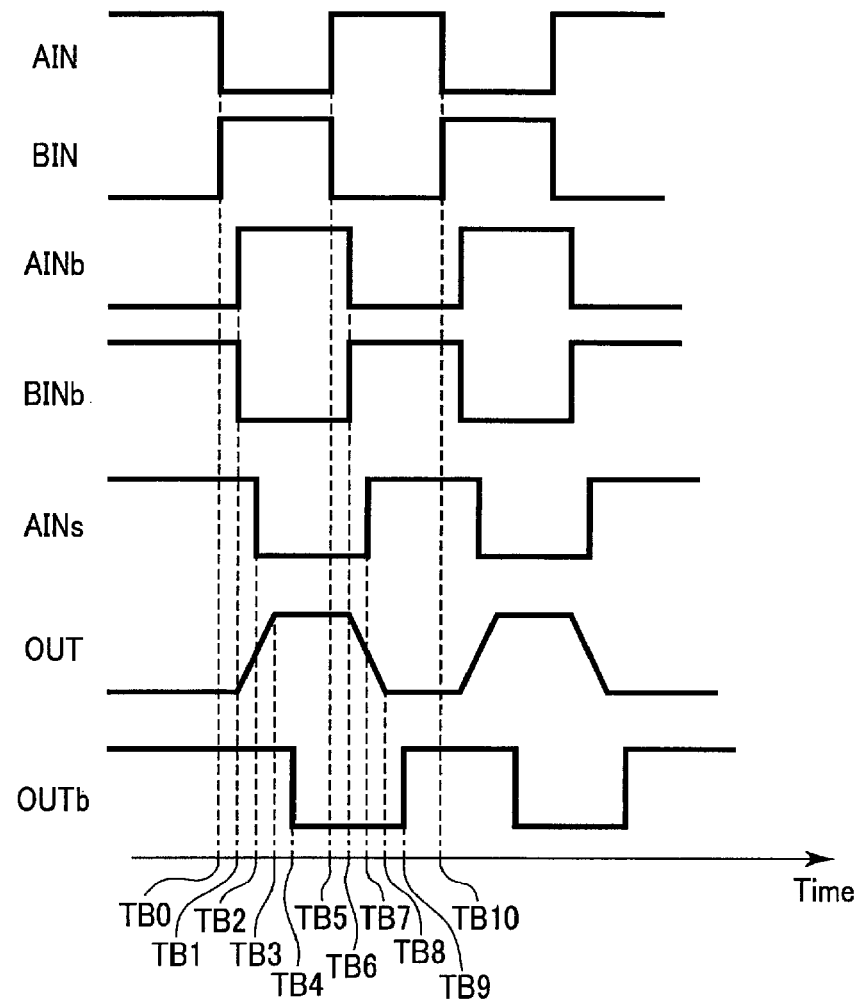
F I G. 9

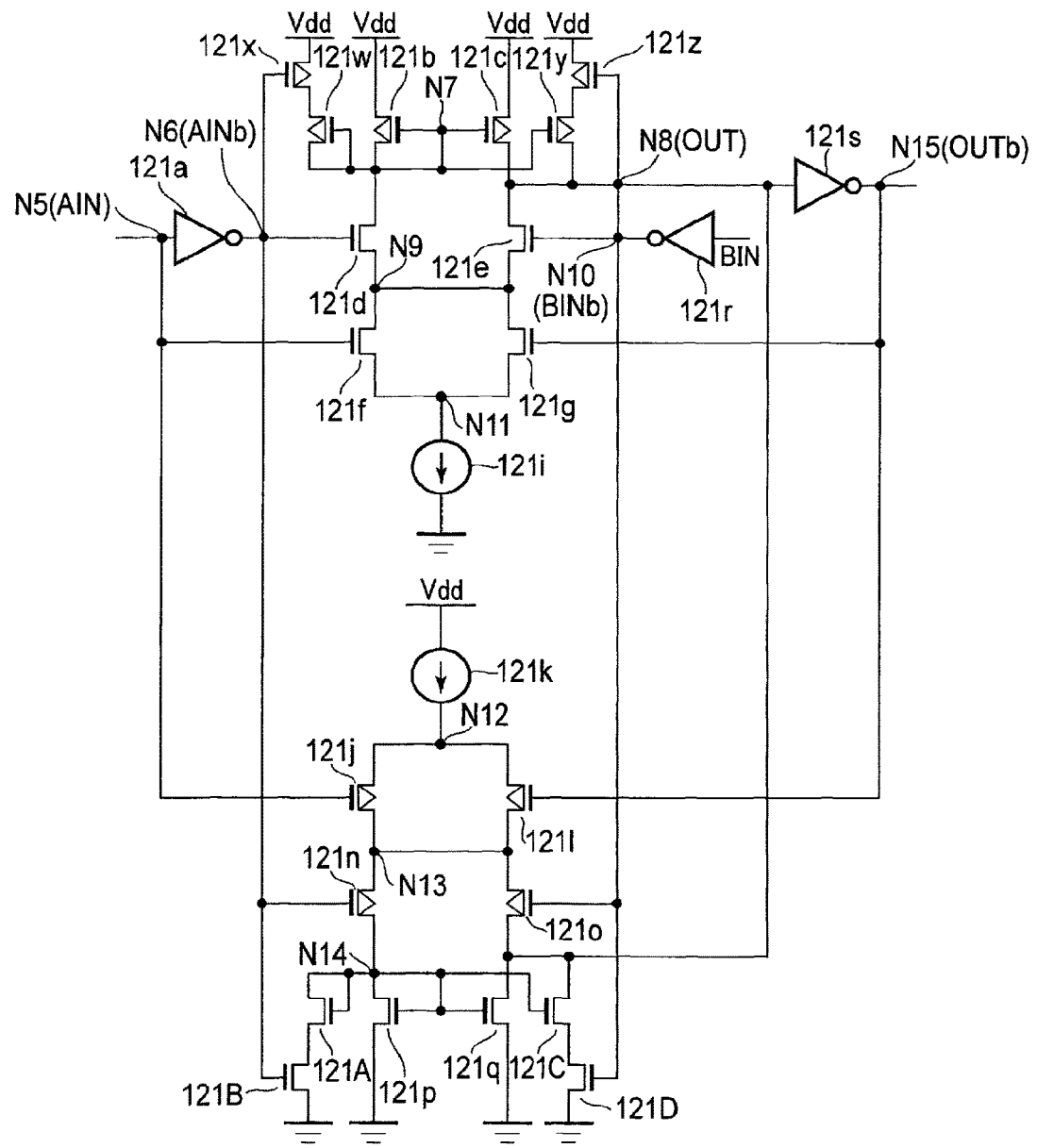
F I G. 10

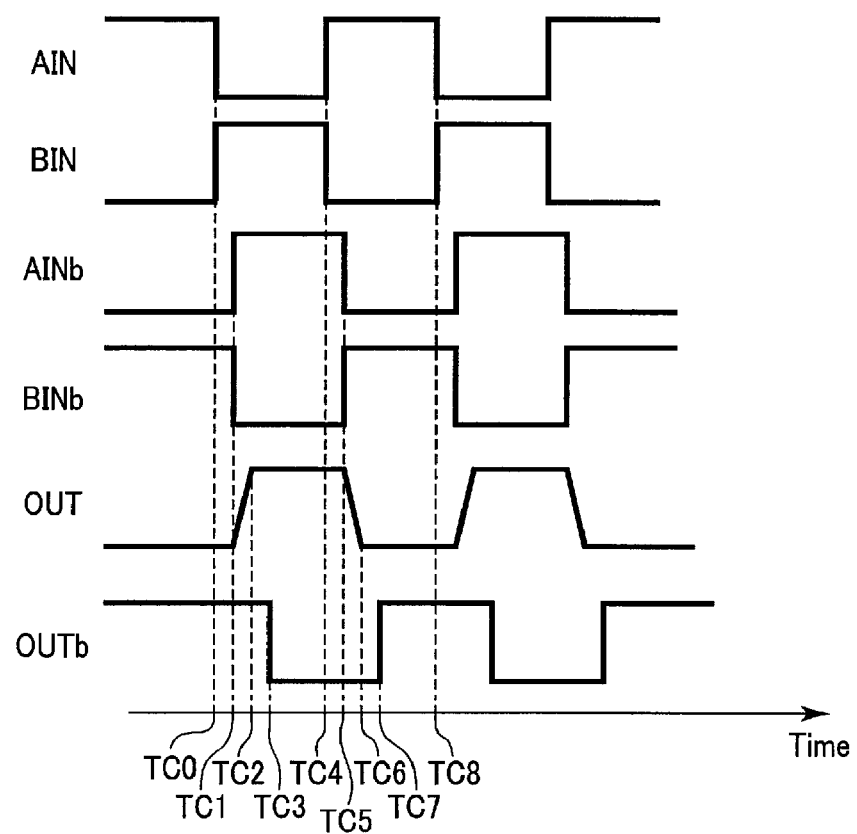
F I G. 11

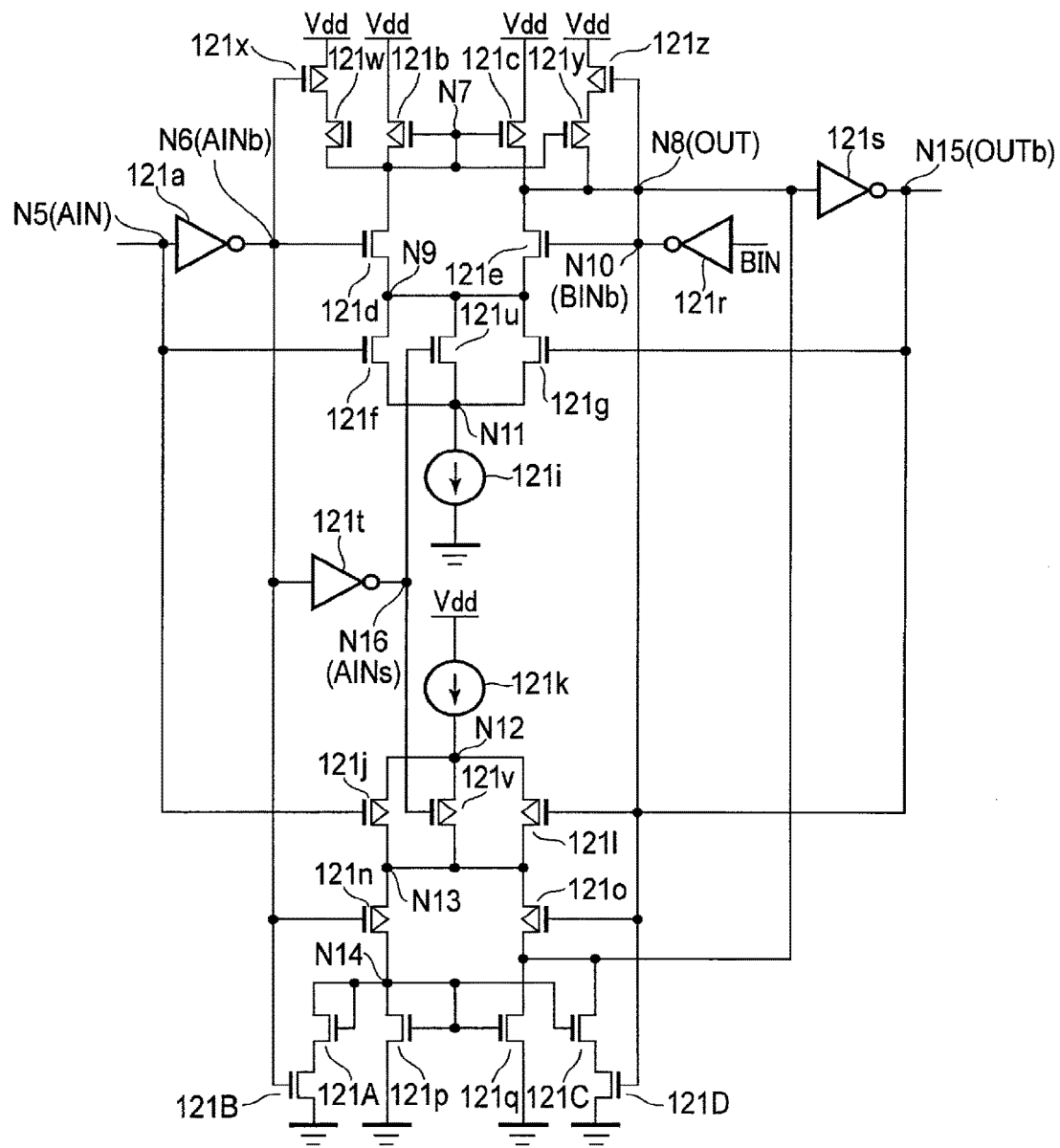
F I G. 14

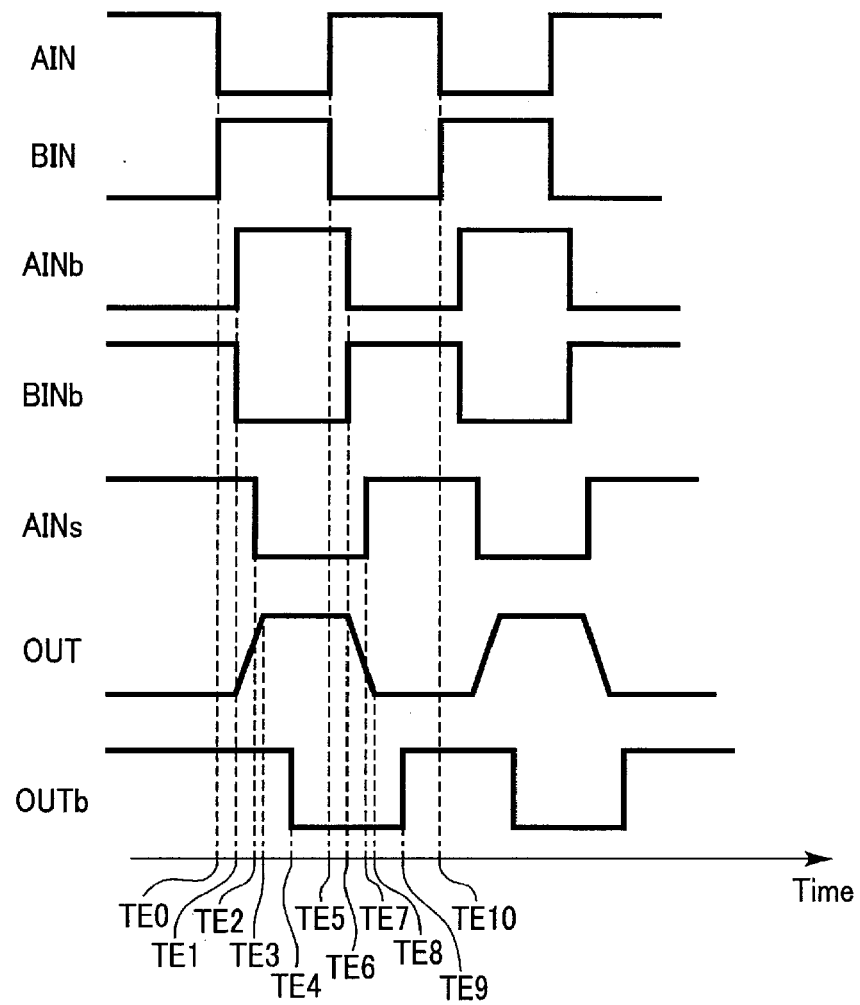
F I G. 15

AMPLIFIER

CROSS-REFERENCE TO RELATED APPLICATIONS

This application claims the benefit of U.S. Provisional Application No. 62/216,174, filed Sep. 9, 2015, the entire contents of which are incorporated herein by reference.

FIELD

Embodiments described herein relate generally to an amplifier.

BACKGROUND

There are an increasing number of high-speed-operating semiconductor memory devices. Accordingly, an amplifier that allows a semiconductor memory device operating at high speed to operate properly is desired.

BRIEF DESCRIPTION OF THE DRAWINGS

FIG. 1 is a block diagram schematically showing a configuration of a memory system including an amplifier according to a first embodiment.

FIG. 2 is a circuit diagram showing a configuration of a clock generator of a semiconductor memory device including the amplifier according to the first embodiment.

FIG. 3 is a circuit diagram showing a basic configuration of the amplifier according to the first embodiment.

FIG. 4 is a waveform chart showing a read operation of the semiconductor memory device including the amplifier according to the first embodiment.

FIG. 6 is a circuit diagram showing a basic configuration of an amplifier according to an comparative example.

FIG. 8 is a circuit diagram showing a basic configuration of an amplifier according to a second embodiment.

FIG. 9 is a waveform chart showing an operation of the amplifier according to the second embodiment.

FIG. 10 is a circuit diagram showing a basic configuration of an amplifier according to a third embodiment.

FIG. 11 is a waveform chart showing an operation of the amplifier according to the third embodiment.

FIG. 14 is a circuit diagram showing a basic configuration of an amplifier according to a fifth embodiment.

FIG. 15 is a waveform chart showing an operation of the amplifier according to the fifth embodiment.

DETAILED DESCRIPTION

Figure 5:
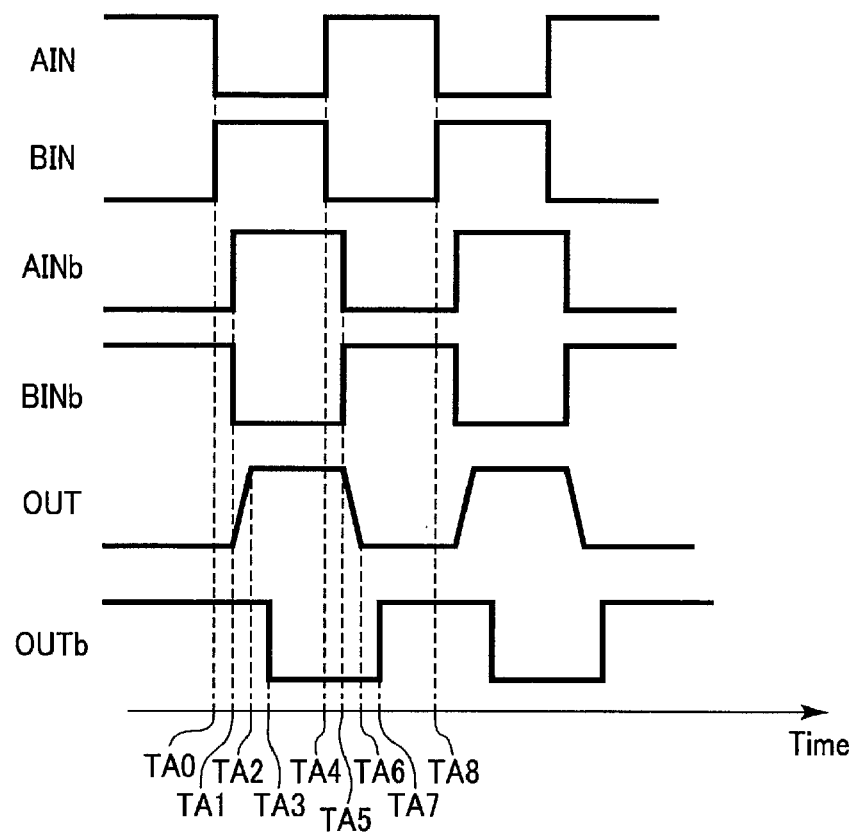
FIG. 5 is a waveform chart showing an operation of the amplifier according to the first embodiment.

In general, according to one embodiment, an amplifier includes: a first inverter which inverts and delays a first signal to generate a second signal; a second inverter which inverts and delays a third signal to generate a fourth signal, the third signal being an inverse signal of the first signal; a first transistor of a first conductive type including a gate electrode supplied with the second signal; a second transistor of the first conductive type including a gate electrode supplied with the fourth signal; an output terminal which is coupled to one terminal of the second transistor and outputs a fifth signal; a third inverter which inverts and delays the fifth signal to generate a sixth signal; and a first discharge circuit which discharges one terminal of the first transistor and the one terminal of the second transistor based on the first signal, the sixth signal, or the fourth signal, the first discharge circuit including one terminal coupled to the other terminal of each of the first and second transistors.

Hereinafter, embodiments will be described with reference to the drawings. In the description, common parts are assigned with common reference numerals throughout the drawings.

<1> First Embodiment

A semiconductor memory device according to an embodiment will be described.

<1-1> Configuration

<1-1-1> Configuration of Memory System

First, a configuration of a memory system including an amplifier according to the present embodiment will be described with reference to FIG. 1.

As shown in FIG. 1, a memory system 1 includes a memory chip 100 and a memory controller 200. The memory chip 100 and the memory controller 200, for example, may form, in combination, one semiconductor device. Examples of such a semiconductor device are a memory card such as an SD™ card and a solid state drive (SSD). The memory system 1 may also include a host device (not shown).

<1-1-2> Memory Controller

The memory controller 200 outputs, for example, commands required for an operation of the memory chip 100 to the memory chip 100. The memory controller 200 outputs commands to the memory chip 100 to, for example, read data from the memory chip 100, write data in the memory chip 100, or erase data from the memory chip 100.

<1-1-3> Memory Chip

The memory chip 100 including the amplifier of the present embodiment will be described with reference to FIG. 1.

The memory controller 200 is coupled to the memory chip 100 via input/output pads 101 and control signal input pads 102.

The input/output pads 101 include a plurality of pads, which are not shown. The input/output pads 101 receive data, commands, and addresses from the memory controller via the plurality of pads, and transmit data and data strobe signals DQS and BDQS (complementary signal of DQS).

The input/output pads 101 include a clock generator 120. The first clock generator 120 generates data strobe signals DQS and BDQS based on a signal supplied by an input/output control circuit 103. The input/output pads 101 output data, together with the above-mentioned data strobe signals DQS and BDQS, to the memory controller 200 via data input/output lines (DQ0-DQ7). The memory controller 200 receives data from the data input/output lines in accordance with timing of the data strobe signals DQS and BDQS. The data input/output lines are coupled to the pads of the input/output pads 101.

The control signal input pads 102 include a plurality of pads, which are not shown. The control signal input pads 102 receive a chip enable signal BCE, a command latch enable signal CLE, an address latch enable signal ALE, a write enable signal BWE, read enable signals RE and BRE, a write protect signal BWP, and data strobe signals DQS and BDQS from the memory controller 200 via the plurality of pads.

The chip enable signal BCE (Bar Chip Enable) is used as a selection signal of the memory chip 100.

The command latch enable signal CLE (Command Latch Enable) is used when an operation command is taken in a command register 104.

The address latch enable signal ALE (Address Latch Enable) is used when address information or input data are taken in an address register 108 or a data register 112.

The write enable signal BWE (Bar Write Enable) is used for taking a command, an address, and data on the input/output pads 101 in the memory chip 100.

The read enable signal RE (Read Enable) is used when causing the input/output pads 101 to serially output data. BRE (Bar Read Enable) is a complementary signal of RE.

The write protect signal BWP (Bar Write Protect) is used to protect data from unexpected erasure or writing when input signals are undefined, such as at power-on or power-off of the memory chip 100.

The data strobe signal DQS is output together with read data during reading, and is supplied together with write data during writing. BDQS is a complementary signal of DQS.

There are also an R/B pad indicating an internal operation status of the memory chip 100, and Vcc/Vss/Vccq/Vssq pads for power supply, although they are not shown in FIG. 1.

The input/output control circuit 103 outputs data read from a memory cell array 110 to the memory controller 200 via the input/output pads 101. The input/output control circuit 103 receives various commands, such as write, read, erase, and status-read commands, addresses, and write data via the input/output pads 101.

The command register 104 outputs commands input from the input/output control circuit 103 to a control circuit 106.

A logic control circuit 105 supplies the input/output control circuit 103 and the control circuit 106 with control signals input via the control signal input pads 102.

The control circuit 106 controls the memory cell array 110, a column decoder 113, a data input/output buffer 110*a*, and a row address decoder 115.

The control circuit 106 performs a control operation in response to control signals input from the logic control circuit 105, and commands input via the command register 104. The control circuit 106 uses an HV generator 107 to generate desired voltages when programming, verifying, reading, and erasing data.

The address register 108 latches an address supplied from the memory controller 200, for example. The address register 108 translates the latched address into an internal physical address, supplies a column address to a column buffer 114, and supplies a row address to a row address buffer decoder 116.

A status register 109 is used to report various internal statuses of the memory chip 100 to the outside.

The memory cell array 110 includes a plurality of bit lines BL, a plurality of word lines WL, and a source line SL. The memory cell array 110 is formed by a plurality of blocks BLK, in which electrically-rewritable memory cell transistors (also simply called memory cells) MC are arranged in a matrix form. A memory cell transistor MC, for example, includes stacked gates including a control gate electrode and a charge accumulation layer (such as a floating gate electrode), and stores binary or multivalued data based on a change of the threshold of the transistor that is determined based on the amount of charge injected into the floating gate electrode. The memory cell transistor MC may have a metal-oxide-nitride-oxide-silicon (MONOS) structure which traps electrons by the nitride film.

The configuration of the memory cell array 110 is disclosed in U.S. patent application Ser. No. 12/397,711 filed Mar. 3, 2009 and entitled "SEMICONDUCTOR MEMORY DEVICE HAVING PLURALITY OF TYPES OF MEMORIES INTEGRATED ON ONE CHIP". In addition, the configuration thereof is disclosed in U.S. patent application Ser. No. 13/451,185 filed Apr. 19, 2012 and entitled "SEMICONDUCTOR MEMORY DEVICE INCLUDING STACKED GATE HAVING CHARGE ACCUMULATION LAYER AND CONTROL GATE AND METHOD OF WRITING DATA TO SEMICONDUCTOR MEMORY DEVICE", in U.S. patent application Ser. No. 12/405,626 filed Mar. 17, 2009 and entitled "NONVOLATILE SEMICONDUCTOR MEMORY ELEMENT, NONVOLATILE SEMICONDUCTOR MEMORY, AND METHOD FOR OPERATING NONVOLATILE SEMICONDUCTOR MEMORY ELEMENT", in U.S. patent application Ser. No. 09/956,986 filed Sep. 21, 2001 and entitled "NONVOLATILE SEMICONDUCTOR MEMORY DEVICE HAVING ELEMENT ISOLATING REGION OF TRENCH TYPE AND METHOD OF MANUFACTURING THE SAME", in U.S. patent application Ser. No. 12/407,403 filed 19 Mar. 2009 and entitled "three dimensional stacked nonvolatile semiconductor memory", in addition, the configuration thereof is disclosed in U.S. patent application Ser. No. 12/406,524 filed 18 Mar. 2009 and entitled "three dimensional stacked nonvolatile semiconductor memory", in U.S. patent application Ser. No. 13/816,799 filed 22 Sep. 2011 and entitled "nonvolatile semiconductor memory device", and in U.S. patent application Ser. No. 12/532,030 filed 23 Mar. 2009 and entitled "semiconductor memory and method for manufacturing the same". The entire descriptions of these patent applications are incorporated by reference herein.

When data is read out, a sense amplifier 111 senses data read out from memory cell transistors MC to bit lines.

A data register 112 is formed by, for example, an SRAM. The data register 112 stores, for example, data supplied by the memory controller 200 and a verification result sensed by the sense amplifier 111.

The column buffer 114 temporarily stores a column address signal input from the address register 108.

The column decoder 113 decodes the column address signal stored in the column buffer 114, and outputs, to the sense amplifier 111, a selection signal which selects one of the bit lines BL.

The row address buffer decoder 116 temporarily stores a row address signal input from the address register 108.

The row address decoder 115 decodes the row address signal input via the row address buffer decoder 116. Then, the row address decoder 115 selects and drives a word line WL and select gate lines SGD and SGS.

<1-1-3-1> Basic Configuration of Clock Generator

The clock generator 120 will be described with reference to FIG. 2. As shown in FIG. 2, the clock generator 120 includes first to fourth amplifiers 121-124, PMOS transistors 125 and 127, and NMOS transistors 126 and 128. The first to fourth amplifiers 121-124 are each a differential amplifier.

As shown in FIG. 2, a signal RE is input to a first input terminal of the first amplifier 121 as a signal AIN(1st) via a pad 102*a* included in the control signal input pads 102 and a node N1. A signal BRE is input to a second input terminal of the first amplifier 121 as a signal BIN(1st) via a pad 102*b* included in the control signal input pads 102 and a node N2.

The first amplifier 121 generates an amplified signal OUT (1st) based on the signal AIN(1st) and the signal BIN(1st).

The signal RE is input to a first input terminal of the second amplifier 122 as a signal AIN(2nd) via the pad 102a and the node N1. The signal BRE is input to a second input terminal of the second amplifier 122 as a signal BIN(2nd) via the pad 102b and the node N2. The second amplifier 122 generates an amplified signal OUT(2nd) based on the signal AIN(2nd) and the signal BIN (2nd).

The PMOS transistor 125 has a gate to which the signal OUT (1st) is input, has one terminal (source) to which a voltage Vccq is applied, and has the other terminal (drain) coupled to a node N3. The NMOS transistor 126 has a gate to which the signal OUT(2nd) is input, has one terminal (drain) coupled to the node N3, and has the other terminal (source) coupled to the ground.

The PMOS transistor 125 charges the node N3 based on the signal OUT(1st). As the node N3 is charged, the data strobe signal DQS rises. The NMOS transistor 126 discharges the node N3 based on the signal OUT(2nd). As the node N3 is discharged, the data strobe signal DQS falls.

The generated data strobe signal DQS is output to the memory controller 200 via a pad 101a included in the input/output pads 101.

The signal BRE is input to a first input terminal of the third amplifier 123 as a signal AIN(3rd) via the pad 102b and the node N2. The signal RE is input to a second input terminal of the third amplifier 123 as a signal BIN(3rd) via the pad 102a and the node N1. The third amplifier 123 generates an amplified signal OUT(3rd) based on the signal AIN(3rd) and the signal BIN (3rd).

The signal BRE is input to a first input terminal of the fourth amplifier 124 as a signal AIN(4th) via the pad 102b and the node N2. The signal RE is input to a second input terminal of the fourth amplifier 124 as a signal BIN(4th) via the pad 102a and the node N1. The fourth amplifier 124 generates an amplified signal OUT(4th) based on the signal AIN(4th) and the signal BIN(4th).

The PMOS transistor 127 has a gate to which the signal OUT(3rd) is input, has one terminal (source) to which the voltage Vccq is applied, and has the other terminal (drain) coupled to a node N4. The NMOS transistor 128 has a gate to which the signal OUT (4th) is input, has one terminal (drain) coupled to the node N4, and has the other terminal (source) coupled to the ground.

The PMOS transistor 127 charges the node N4 based on the signal OUT(3rd). As the node N4 is charged, the data strobe signal BDQS rises. The NMOS transistor 128 discharges the node N4 based on the signal OUT(4th). As the node N4 is discharged, the data strobe signal BDQS falls.

The generated data strobe signal BDQS is output to the memory controller 200 via a pad 101b included in the input/output pads 101.

The first amplifier 121, the second amplifier 122, the third amplifier 123, and the fourth amplifier 124 have the same configuration and are each merely referred to as an amplifier when they are not distinguished from one another. When the signals AIN(1st), AIN(2nd), AIN(3rd), and AIN(4th) are not distinguished from one another, they are each merely referred to as signal AIN. When the signals BIN (1st), BIN (2nd), BIN (3rd), and BIN(4th) are not distinguished from one another, they are each merely referred to as signal BIN. When the amplified signals OUT(1st), OUT(2nd), OUT (3rd), and OUT(4th) are not distinguished from one another, they are each merely referred to as signal OUT.

<1-1-3-2> Basic Configuration of Amplifier

The amplifier will be described with reference to FIG. 3. As shown in FIG. 3, the amplifier includes inverters 121a, 121r, and 121s, PMOS transistors 121b, 121c, 121j, 121l, 121m, 121n, and 121o, NMOS transistors 121d, 121e, 121f, 121g, 121h, 121p, and 121q, and constant current sources 121i and 121k.

Based on the signal AIN, the NMOS transistor 121f and the PMOS transistor 121j go into the ON state or the OFF state. The inverter 121a receives the signal AIN via a node N5, and outputs an inverse output signal AINb to a node N6. Based on the inverse output signal AINb, the NMOS transistor 121d and the PMOS transistor 121n go into the ON state or the OFF state. The inverter 121a outputs an inverse signal a predetermined time after a received signal is input thereto. Namely, the inverse output signal AINb delayed by the inverter 121a is supplied to the node N6. The same applies to the inverters 121r and 121s. Hereinafter, the signal delayed by each inverter is also referred to as a delayed signal.

The inverter 121r receives the signal BIN, and outputs an inverse output signal BINb to a node N10. Based on the signal BINb, the NMOS transistors 121e and 121h and PMOS transistors 121m and 121o go into the ON state or the OFF state.

The PMOS transistors 121b and 121c go into the ON state or the OFF state depending on the potential of a node N7. When the PMOS transistor 121b goes into the ON state, the node N7 is coupled to a node applied with a power supply voltage Vdd. When the PMOS transistor 121c goes into the ON state, a node N8 is coupled to a node applied with the power supply voltage Vdd. Node N8 is coupled to the output terminal of the amplifier, and a signal of the node N8 is output as the signal OUT. The PMOS transistors 121b and 121c form a current mirror and a charge circuit. The NMOS transistors 121f, 121g, and 121h form a discharge circuit.

The inverter 121s is coupled to the node N8, and outputs an inverse output signal OUTb to a node N15. Based on the signal BINb, the NMOS transistors 121e and 121h, and the PMOS transistors 121m and 121o go into the ON state or the OFF state.

When at least one of the NMOS transistors 121f, 121g, and 121h goes into the ON state, the potential of a node N9 decreases via the ground, the constant current source 121i, and a node N11.

When at least one of the PMOS transistors 121j, 121m, and 121l goes into the ON state, the potential of a node N13 increases via the power supply voltage, the constant current source 121k, and the node N12.

The NMOS transistors 121p and 121q go into the ON state or the OFF state based on the potential of a node N14. When the NMOS transistor 121p goes into the ON state, the potential of the node N14 decreases. When the NMOS transistor 121q goes into the ON state, the potential of the node N8 decreases. The NMOS transistors 121p and 121q form a current mirror and a discharge circuit. NMOS transistors 121j, 121l, and 121m form a charge circuit.

<1-2> Operation

<1-2-1> Basic Data Output Operation

A data output operation of the memory chip according to the first embodiment will be described with reference to FIG. 4.

[Time T0]

At time T0, the memory controller 200 lowers the chip enable signal BCE from the high (H) level to the low (L) level.

[Time T1]

At time T1, which is a predetermined time after the time T0, the memory controller 200 raises the read enable signal RE from the L level to the H level, and lowers the read enable signal BRE from the H level to the L level.

[Time T2]

At time T2, which is time $t_{DQSRE}$ after the time T1, the input/output control circuit 103 supplies the clock generator 120 with a trimming signal. The clock generator 120 generates the data strobe signals DQS and BDGS based on the trimming signal.

At the time T2, the clock generator 120 lowers the data strobe signal DQS to the L level, and raises the data strobe signal BDQS to the H level.

[Time T3]

At time T3, the memory controller 200 lowers the read enable signal RE from the H level to the L level, and raises the read enable signal BRE from the L level to the H level.

[Time T4]

At time T4, the memory controller 200 raises the read enable signal RE from the L level to the H level, and lowers the read enable signal BRE from the H level to the L level.

[Time T5]

Between the time T3 and time T5, the clock generator 120 raises the data strobe signal DQS to the H level, and lowers the data strobe signal BDQS to the L level.

Accordingly, the level of data strobe signal DQS crosses the level of data strobe signal BDQS at the time T5, which is time $t_{DSQRE}$ after the time T3.

[Time T6]

The input/output control circuit 103 starts output of data D0 at T6, which is time $t_{QSQ}$ after the time T5.

[Time T7]

The input/output control circuit 103 completes the output of data D0 between the time T6 and time T7, which is time $t_{DVW}$ after the time T6.

[Time T8]

Between the time T4 and time T8, the clock generator 120 lowers the data strobe signal DQS to the L level, and raises the data strobe signal BDQS to the H level.

Accordingly, the level of data strobe signal DQS crosses the level of data strobe signal BDQS at the time T8, which is time $t_{DQSRE}$ after the time T4.

[Time T9 to Time T15]

By repeating the operations from the time T5 to the time T8, the input/output control circuit 103 outputs data D1-Dn (n being a natural number) to the memory controller 200 based on the data strobe signals DQS and BDQS.

As described, the memory controller 200 and the memory chip 100 can transmit and receive data during the time $t_{DVW}$ defined by the data strobe signals DQS and BDQS. The time $t_{DVW}$ is a period in which the data strobe signals DQS and BDQS are at the H level or L level. When the level of data strobe signal DQS crosses the level of data strobe signal BDQS, transmitted data is switched. Namely, unless the level of data strobe signal DQS crosses the level of data strobe signal BDQS, the memory controller 200 and memory chip 100 cannot properly transmit or receive data. Thus, the amplifier according to the present embodiment generates the signal OUT so that proper data strobe signals DQS and BDQS are generated. A specific method for generating the signal OUT will be described below.

<1-2-2> Operation for Generating Signal OUT

An operation for generating the signal OUT by the amplifier will be described with reference to FIGS. 2, 3, and 5. For simplification, an operation for generating the signal OUT by the first amplifier 121 will be described.

[Time TA0 to Time TA1]

As shown in FIGS. 3 and 5, at time TA0, the signal AIN falls from the H level to the L level, and the signal BIN rises from the L level to the H level. At the time TA0, the signal AINb and the signal OUT are at the L level, and the signal BINb and the signal OUTb are at the H level.

The H level herein refers to a potential that can make NMOS transistors in the ON state, and PMOS transistors in the OFF state. The L level refers to a potential that can make NMOS transistors in the OFF state, and PMOS transistors in the ON state. The ON state is a state in which the source and drain of a transistor are electrically coupled to each other by a channel. The OFF state is a state in which the source and drain of a transistor are not electrically coupled to each other. A leak current or the like may flow between the source and the drain even in the OFF state. However, such a state is still regarded as the OFF state, not the ON state.

The NMOS transistors 121e, 121g, and 121h are in the ON state, and node N8 is coupled to the ground via the constant current source 121i.

The PMOS transistors 121j and 121n are in the ON state, and the node N14 is supplied with a current via the constant current 121k. Accordingly, the node N14 transitions to the H level, and the NMOS transistors 121p and 121q are in the ON state. The node N8 is coupled to the ground via the NMOS transistor 121q.

As described, the node N8 is coupled to a node coupled to the ground via a plurality of transistors. Therefore, the signal OUT is maintained at the L level even when an operation is performed at high speed (the frequency of the input signal is high).

[Time TA1 to Time TA4]

At time TA1, the signal AINb rises from the L level to the H level, and the signal BINb falls from the H level to the L level.

The NMOS transistors 121d and 121g are in the ON state, and the node N7 is coupled to the ground via the constant current source 121i. Thus, the node N7 transitions to the L level state, and the PMOS transistors 121b and 121c are in the ON state. The node N8 is supplied with a current via the PMOS transistor 121c.

The PMOS transistors 121j, 121m, and 121o are in the ON state, and the node N8 is supplied with a current via the constant current source 121k.

The operation from the time TA1 to time TA2 is an operation for bringing the signal OUT to the H level. As described above, the node N8 is supplied with a current by a plurality of transistors. However, between the time TA1 and the time TA2, the potential of the node N8 has not been sufficiently increased yet, so the signal OUT is at the L level.

At the time TA2, the potential of the node N8 increases sufficiently, and the signal OUT rises from the L level to the H level. At time TA3, signal OUTb falls from the H level to the L level.

[Time TA4 to Time TA5]

At time TA4, the signal AIN rises from the L level to the H level, and the signal BIN falls from the H level to the L level. At the time TA4, the signal AINb and signal OUT are at the H level, and the signal BINb and signal OUTb are at the L level.

The NMOS transistors 121d and 121f are in the ON state, and the potential of the node N7 is maintained at the L level. Accordingly, the node N8 is supplied with a current via the PMOS transistor 121c.

The PMOS transistors 121m, 121l, and 121o are in the ON state, and the node N8 is supplied with a current via the constant current source 121k and the PMOS transistors 121m, 121l, and 121o.

As described, the node N8 is supplied with a current by a plurality of transistors. Therefore, the signal OUT is maintained at the H level even when an operation is performed at high speed.

[Time TA5 to Time TA8]

At time TA5, the signal AINb falls from the H level to the L level, and the signal BINb rises from the L level to the H level.

The NMOS transistors 121e, 121f, and 121h are in the ON state, and the node N8 is coupled to the ground via the constant current source 121i.

The PMOS transistors 121l and 121n are in the ON state, and the node N14 is supplied with a current. As a result, the NMOS transistor 121q are in the ON state.

The operation from the time TA5 to the time TA6 is an operation for bringing the signal OUT to the L level. As described above, the node N8 is coupled to the ground via a plurality of transistors. However, between the time TA5 and the time TA6, the potential of the node N8 has not been sufficiently decreased yet, so the signal OUT is at the H level.

At time TA6, the potential of the node N8 decreases sufficiently, and the signal OUT falls from the H level to the L level. At time TA7, the signal OUTb rises from the L level to the H level.

[Time TA8 Onward]

The amplifier performs the same operation as the one performed at the time TA0.

<1-2-3> Operation for Generating Data Strobe Signal

As described above, the amplifier changes the level of the signal OUT to the H level or the L level based on the signals AIN and BIN. The PMOS transistor 125 (see FIG. 2) is thereby properly controlled.

Descriptions has been given of only the first amplifier 121. However, the second amplifier 122 performs the same operation as that of the first amplifier 121. As a result, the NMOS transistor 126 (see FIG. 2) is properly controlled.

The third amplifier 123 also performs the same operation as that of the first amplifier 121. However, when the above-described operation is applied to the third amplifier 123, the signal AIN and the signal BIN are interchanged. The PMOS transistor 127 (see FIG. 2) is thereby properly controlled.

In addition, the fourth amplifier 124 also performs the same operation as that of the first amplifier 121. However, when the above-described operation is applied to the fourth amplifier 124, the signal AIN and the signal BIN are interchanged. The NMOS transistor 128 (see FIG. 2) is thereby properly controlled.

In the above-described manner, a proper data strobe signal DQS is generated by the first amplifier 121 and the second amplifier 122, and a proper data strobe signal BDQS is generated by the third amplifier 123 and the fourth amplifier 124.

Thus, the memory chip 100 can have the level of the data strobe signal DQS properly cross the level of the data strobe signal BDQS. As a result, the memory chip 100 can properly transmit data to the memory controller 200.

<1-3> Advantages of Embodiment

According to the above-described embodiment, the amplifier includes the NMOS transistor 121h and the PMOS transistor 121m operated by signal BINb. This enables discharge of the node N8 via the NMOS transistor 121h, or charge of the node N8 via the PMOS transistor 121m. The signal BINb is a signal delayed by a delay circuit of one stage by the inverter 121r.

A comparative example will be described below. Unlike the amplifier according to the present embodiment, as shown in FIG. 6, the amplifier according to the comparative example does not include the NMOS transistor 121h or PMOS transistor 121m.

Figure 7:
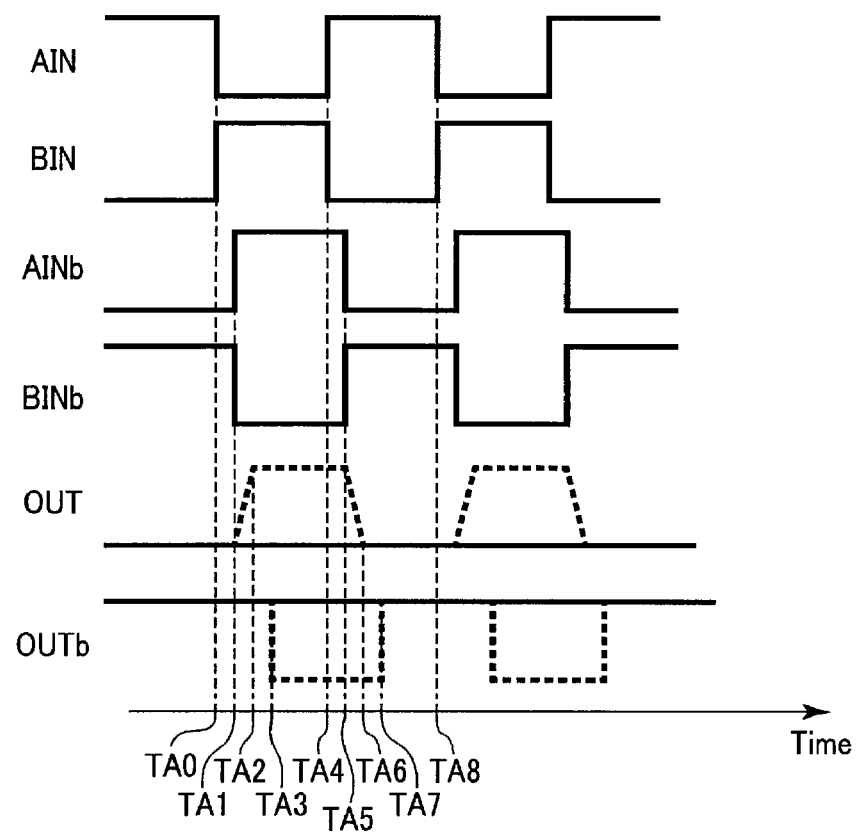
FIG. 7 is a waveform chart showing an operation of the amplifier according to the comparative example.

The amplifier according to the comparative example can properly charge the node N8 by bringing the PMOS transistor 121l to the ON state while the PMOS transistor 121j is in the ON state, for example. However, if the amplifier according to the comparative example is operated at high speed, the node N8 may not be properly charged. Specifically, as shown in FIGS. 5 and 6, the node N8 is charged between the time TA1 and the time TA2 via the PMOS transistor 121c, the constant current source 121k, and the PMOS transistors 121j and 121o. However, if the amplifier according to the comparative example is operated at high speed, the signal AIN may rise to the H level before the node N8 is sufficiently charged. As a result, as shown in FIG. 7, the waveform of the signal OUT may be maintained at a particular level (L level in FIG. 7). Thus, a proper signal OUT which corresponds to the input signals AIN and BIN is not generated, which may not be able to operate the clock generator 120 properly.

However, even if the amplifier of the present embodiment is operated at high speed, discharge of the node N8 via the NMOS transistor 121h, and charge of the node N8 via the PMOS transistor 121m can be performed. As a result, even when the amplifier is operated at high speed, a proper signal OUT can be generated. Accordingly, the clock generator 120 can generate proper data strobe signals DQS and BDQS even in a high-speed operation.

The memory 100 and the memory controller 200 can therefore properly transmit and receive data when the memory system 1 is operated at high speed.

<2> Second Embodiment

The second embodiment will be described. In the second embodiment, the description will be given of a modification of the amplifier. The basic configuration and operation of the memory device according to the second embodiment are the same as those of the memory device according to the first embodiment. Thus, descriptions of matters described in the first embodiment and matters easily inferable from the first embodiment will be omitted.

<2-1> Basic Configuration of Amplifier

One of the first to fourth amplifiers 121-124 will be described with reference to FIG. 8. As shown in FIG. 8, the amplifier includes inverters 121a, 121r, 121s, and 121t, PMOS transistors 121b, 121c, 121j, 121l, 121n, 121o, and 121v, NMOS transistors 121d, 121e, 121f, 121g, 121p, 121q, and 121u, and constant current sources 121i and 121k.

The inverter 121t receives the signal AINb via the node N6, and outputs an inverse output signal AINs to the node N16. Based on the signal AINs, the NMOS transistor 121u and the PMOS transistor 121v go into the ON state or the OFF state. When the NMOS transistor 121u goes into the ON state, the node N9 is electrically coupled to the node N11. When the PMOS transistor 121v goes into the ON state, the node N12 is electrically coupled to the node N13. The inverter 121t outputs an inverse signal a predetermined time after a received signal is input thereto. Namely, the signal AINs delayed by the inverters 121a and 121t is supplied to node N16.

The NMOS transistors 121*f*, 121*g*, and 121*u* form a discharge circuit. The PMOS transistors 121*j*, 121*l*, and 121*v* form a charge circuit.

<2-2> Operation

<2-2-1> Operation for Generating Signal OUT

An operation for generating the signal OUT by the amplifier will be described with reference to FIGS. 8 and 9. For simplification, an operation for generating the signal OUT by the first amplifier 121 will be described.

[Time TB0 to Time TB1]

At time TB0, the signal AIN falls from the H level to the L level, and the signal BIN rises from the L level to the H level. At the time TB0, the signal AINb and the signal OUT are at the L level, and the signal BINb, the signal AINs, and the signal OUTb are at the H level.

The NMOS transistors 121*e*, 121*g*, and 121*u* are in the ON state, and the node N8 is coupled to the ground via the constant current source 121*i*.

As described in the first embodiment, at the time TB0, the node N8 is coupled to the ground via NMOS transistor 121*q*.

As described, the node N8 is coupled to the ground via a plurality of transistors. Therefore, the signal OUT is maintained at the L level even when an operation is performed at high speed.

[Time TB1 to Time TB2]

At time TB1, the signal AINb rises from the L level to the H level, and the signal BINb falls from the H level to the L level.

The NMOS transistors 121*d*, 121*g*, and 121*u* are in the ON state, and the node N7 is coupled to the ground via the constant current source 121*i*. Thus, the node N7 transitions to the L level state, and the PMOS transistors 121*b* and 121*c* are in the ON state. The Node N8 is supplied with a current via the PMOS transistor 121*c*.

The PMOS transistors 121*j* and 121*o* are in the ON state, and the node N8 is supplied with a current via the constant current source 121*k*.

The operation from the time TB1 to the time TB2 is an operation for bringing the signal OUT to the H level. As described above, the node N8 is supplied with a current by a plurality of transistors. However, at the TB1, the potential of the node N8 has not been sufficiently increased yet, so the signal OUT is at the L level.

[Time TB2 to Time TB5]

At time TB2, the signal AINs falls from the H level to the L level.

The NMOS transistor 121*u* is in the OFF state, whereas the PMOS transistor 121*v* is in the ON state. Accordingly, the node N8 is further supplied with a current via the PMOS transistors 121*v*, 121*j*, and 121*o* and the constant current source 121*k*. As described, the operation from the time TB2 to the time TB3 is an operation for bringing signal OUT to the H level. However, at the TB2, the potential of the node N8 has not been sufficiently increased yet, so the signal OUT is at the L level.

When the potential of the node N8 increases sufficiently at time TB3, the signal OUT rises from the L level to the H level. At time TB4, the signal OUTb falls from the H level to the L level.

As described, even if the signal OUT does not transition to the H level between the time TB1 and the time TB2 during a high-speed operation, the amplifier can more reliably bring the signal OUT to the H level.

[Time TB5 to Time TB6]

At time TB5, the signal AIN rises from the L level to the H level, and the signal BIN falls from the H level to the L level. At the time TB5, the signal AINb and the signal OUT are at the H level, and the signal BINb, the signal AINs, and the signal OUTb are at the L level.

The NMOS transistors 121*d* and 121*f* are in the ON state, and the potential of the node N7 is maintained at the L level. Accordingly, the node N8 is supplied with a current via the PMOS transistor 121*c*.

The PMOS transistors 121*o*, 121*l*, and 121*v* are in the ON state, and the node N8 is supplied with a current via the constant current source 121*k* and the PMOS transistors 121*v*, 121*l*, and 121*o*.

As described, the node N8 is supplied with a current by a plurality of transistors. Therefore, the signal OUT is maintained at the H level.

[Time TB6 to Time TB7]

At time a TB6, the signal AINb falls from the H level to the L level, and the signal BINb rises from the L level to the H level.

The NMOS transistors 121*e* and 121*f* are in the ON state, and the node N8 is coupled to the ground via the constant current source 121*i*.

The PMOS transistors 121*l*, 121*n*, and 121*v* are in the ON state, and the node N14 is supplied with a current. As a result, the NMOS transistors 121*p* and 121*q* are in the ON state. The Node N8 is coupled to the ground via the NMOS transistor 121*q*.

The operation from the time TB6 to time TB7 is an operation for bringing signal OUT to the L level. As described above, node NB is supplied with a current by a plurality of transistors. However, between the time TB6 and the time TB7, the potential of node N8 has not been sufficiently decreased yet, so the signal OUT is at the H level.

[Time TB7 to Time TB10]

At time TB7, the signal AINs rises from the L level to the H level.

The NMOS transistor 121*u* are in the ON state. A current flows from the node N8 to the constant current source 121*i*. Accordingly, the node N8 is coupled to the ground via the NMOS transistor 121*u* and the constant current source 121*i*. However, at the TB7, the potential of the node N8 has not been sufficiently decreased yet, so the signal OUT is at the H level.

When the potential of the node N8 is sufficiently decreased at time TB8, the signal OUT falls from the H level to the L level. At time TB9, the signal OUTb rises from the L level to the H level.

The operation from the time TB7 to time TB10 is an operation for bringing the signal OUT to the L level. Accordingly, even if the signal OUT does not transition to the L level between the time TB6 and the time TB7 during a high-speed operation, the amplifier can more reliably bring the signal OUT to the L level.

[Time TB10 Onward]

The amplifier performs the same operation as the one performed at the time TB0.

<2-2-2> Operation for Generating Data Strobe Signal

As described above, the amplifier changes the level of the signal OUT to the H level or the L level based on the signals AIN and BIN. The PMOS transistor 125 (see FIG. 2) is thereby properly controlled. As in the above-described first embodiment, the second to fourth amplifiers 122-124 also perform the same operation as that of the first amplifier 121.

As a result, a proper data strobe signal DQS is generated by the first amplifier 121 and the second amplifier 122, and a proper data strobe signal BDQS is generated by the third amplifier 123 and the fourth amplifier 124.

Thus, the memory chip 100 can have the level of the data strobe signal DQS properly cross the level of the data strobe signal BDQS. As a result, the memory chip 100 can properly transmit data to the memory controller 200.

<2-3> Advantages

According to the above-described embodiment, the amplifier includes the NMOS transistor 121$u$ and the PMOS transistor 121$v$ operated by the signal AINs. The signal AINs is a signal delayed by delay circuits of two stages by the inverter 121$a$ and inverter 121$t$. Even when the frequency of the input signal is high, in comparison with the first embodiment, the NMOS transistor 121$u$ and the PMOS transistor 121$v$ are operated by using a signal that is delayed more than signal BINb. Thus, the node N8 can be set to a desirable potential more reliably than in the first embodiment.

<3> Third Embodiment

The third embodiment will be described. In the third embodiment, the description will be given of a modification of the amplifier. The basic configuration and operation of the memory device according to the third embodiment are the same as those of the memory device according to the first embodiment. Thus, descriptions of matters described in the first embodiment and matters easily inferable from the first embodiment will be omitted.

<3-1> Basic Configuration of Amplifier

One of the first to fourth amplifiers 121-124 will be described with reference to FIG. 10. As shown in FIG. 10, the amplifier includes inverters 121$a$, 121$r$, and 121$s$, PMOS transistors 121$b$, 121$c$, 121$j$, 121$l$, 121$n$, 121$o$, 121$w$, 121$x$, 121$y$, and 121$z$, NMOS transistors 121$d$, 121$e$, 121$f$, 121$g$, 121$p$, 121$q$, 121A, 121B, 121C, and 121D, and constant current sources 121$i$ and 121$k$.

The PMOS transistors 121$x$ and 121$w$ are serially coupled between a node applied with the power supply voltage Vdd and the node N7.

The PMOS transistor 121$w$ goes into the ON state or the OFF state based on the potential of the node N7. The PMOS transistor 121$x$ goes into the ON state or the OFF state based on the potential of the node N6.

The PMOS transistors 121$y$ and 121$z$ are serially coupled between a node applied with the power voltage Vdd and the node N8. The PMOS transistor 121$y$ goes into the ON state or the OFF state based on the potential of the node N7. The PMOS transistor 121$z$ goes into the ON state or the OFF state based on the potential of the node N10.

The PMOS transistors 121$b$, 121$c$, 121$w$, 121$x$, 121$y$, and 121$y$ form a current mirror and a charge circuit. A current-mirror's mirror ratio (or, ratio of the mirrored current and the to-be-mirrored current) has a value other than one, when a transistor which sends the to-be-mirrored current differs from a transistor which sends the mirrored current in drivability (or, the width of the channel). For this reason, when a current flows only through one of the PMOS transistors 121$w$ and 121$y$ with one of the PMOS transistors 121$x$ and 121$z$ being turned off, the mirror ratio of the current mirror has a value other than one.

The NMOS transistors 121A and 121B are serially coupled between the node N14 and the ground. The NMOS transistor 121A goes into the ON state or the OFF state based on the potential of the node N14. The NMOS transistor 121B goes into the ON state or the OFF state based on the potential of the node N6.

The NMOS transistors 121C and 121D are serially coupled between the node N8 and the ground. The NMOS transistor 121C goes into the ON state or the OFF state based on the potential of the node N14. The NMOS transistor 121D goes into the ON state or the OFF state based on the potential of the node N10.

The NMOS transistors 121$p$, 121$q$, 121A, 121B, 121C, and 121D form a current mirror and a discharge circuit. When a current flows only through one of the NMOS transistors 121A and 121C with one of the NMOS transistors 121B and 121D being turned off, the mirror ratio of the current mirror has a value other than one.

<3-2> Operation

<3-2-1> Operation for Generating Signal OUT

An operation for generating the signal OUT by the amplifier will be described with reference to FIGS. 10 and 11.

For simplification, an operation for generating the signal OUT by the first amplifier 121 will be described.

[Time TC0 to Time TC1]

At time TC0, the signal AINb and the signal OUT are at the L level, and the signal BINb and the signal OUTb are at the H level. The PMOS transistor 121$x$ and the NMOS transistor 121D are in the ON state. The NMOS transistors 121$e$ and 121$g$ are in the ON state, and the node N8 is coupled to the ground via the constant current source 121$i$.

At the time TC0, the signal AIN falls from the H level to the L level, and the signal BIN rises from the L level to the H level. The PMOS transistors 121$j$ and 121$n$ are in the ON state, and the node N14 is supplied with a current via the constant current source 121$k$. This brings the node N14 to the H level, which brings the NMOS transistors 121$p$, 121$q$, 121A, and 121C into the ON state. This results in the node N8 coupled to the ground via the NMOS transistor 121$q$, and also coupled to the ground via the NMOS transistors 121C and 121D. As a result, the node N8 is coupled to the ground via two parallel-coupled NMOS transistors 121$q$ and 121C, whereas the node N14 is coupled to the ground via one NMOS transistor 121$p$. For this reason, the current drivability of the NMOS transistor 121$p$ at the to-be-mirrored side is higher than the combined current-drivability of the NMOS transistors 121$q$ and 121C at the mirrored side, and in other words the mirror ratio is larger than one. Therefore, a larger current flows into the ground from the node N8 than in the case without the NMOS transistor 121C, and the potential of the node N8 is maintained at the L level more strongly than in the case without the NMOS transistor 121A.

As described, the node N8 is coupled to a node coupled to the ground via a plurality of transistors.

Therefore, the signal OUT is maintained at the L level even when an operation is performed at high speed (the frequency of the input signal is high).

[Time TC1 to Time TC4]

At time TC1, the signal AINb rises from the L level to the H level, and the signal BINb falls from the H level to the L level.

The PMOS transistor 121$x$ and the NMOS transistor 121D are in the OFF state, and the PMOS transistors 121$z$ and 121B are in the ON state. The NMOS transistors 121$d$ and 121$g$ are in the ON state, and the node N7 is coupled to the ground via the constant current source 121$i$. Therefore, the PMOS transistors 121$b$, 121$c$, 121$w$, and 121$y$ are in the ON state. As a result, the node N8 is coupled to a node applied with the power supply voltage Vdd via two parallel-coupled PMOS transistors 121$c$ and 121$y$, whereas the node N7 is coupled to a node applied with the power voltage Vdd via one PMOS transistor 121$b$. For this reason, the combined current drivability of the PMOS transistors 121$c$ and 121$y$ at the to-be-mirrored side is higher than the current drivability of the PMOS transistor 121$b$ at the mirrored side, and in other words the mirror ratio is larger than one. Therefore, a larger current is supplied to the node N8 than in the case without the PMOS transistor 121y, and the potential of the node N8 rises more quickly than in the case without the PMOS transistor 121y.

Moreover, the PMOS transistors 121j and 121o are in the ON state, and the node N8 is supplied with a current via the constant current source 121k. A part of this current flows into the ground via the NMOS transistor 121q. At this time, the node N8 is coupled to the ground via one NMOS transistor 121q, whereas the node N14 is coupled to the ground via the two parallel-coupled NMOS transistors 121p and 121A. As a result, the combined current drivability of the NMOS transistors 121p and 121A at the to-be-mirrored side is higher than the current drivability of the NMOS transistor 121q at the mirrored side, and in other words the mirror ratio is smaller than one. Therefore, a smaller part of the current which flows into the node N8 flows into the ground than in the case without the NMOS transistor 121A, and the potential of the node N8 rises more quickly than in the case without the NMOS transistor 121A.

The operation from the time TC1 to time TC2 is an operation for bringing the signal OUT to the H level. As described above, the node N8 is supplied with a current via a plurality of transistors. However, at the time TC1, the potential of the node N8 has not been sufficiently increased yet, so the signal OUT is at the L level.

At the time TC2, the potential of the node N8 increases sufficiently, and the signal OUT rises from the L level to the H level. At time TC3, the signal OUTb falls from the H level to the L level.

[Time TC4 to Time TC5]

At time TC4, the signal AINb and the signal OUT are at the H level, and the signal BINb and the signal OUTb are at the L level. At the time TC4, the signal AIN rises from the L level to the H level, and the signal BIN falls from the H level to the L level.

The NMOS transistors 121d and 121f are in the ON state, and the potential of the node N7 is maintained at the L level. Thus, the node N8 is supplied with a current via the PMOS transistors 121c and 121y.

The PMOS transistors 121l and 121o are in the ON state, and the node N8 is supplied with a current via the constant current source 121k, and the PMOS transistors 121l and 121o.

As described, the node N8 is supplied with a current via a plurality of transistors. Thus, the signal OUT is maintained at the H level.

[Time TC5 to Time TC7]

At time TC5, the signal AINb falls from the H level to the L level, and the signal BINb rises from the L level to the H level.

The NMOS transistors 121e and 121f are in the ON state, and the node N8 is coupled to the ground via the constant current source 121i. The PMOS transistor 121x and the NMOS transistor 121D are in the ON state, and the PMOS transistor 121z and the NMOS transistor 121B are in the OFF state. As a result, the node N8 is coupled to a node applied with the power voltage Vdd via one PMOS transistor 121c, whereas the node N7 is coupled to a node applied with the power voltage Vdd via two parallel-coupled PMOS transistors 121b and 121w. For this reason, the combined current drivability of the PMOS transistors 121b and 121w at the to-be-mirrored side is higher than the current drivability of the PMOS transistor 121c at the mirrored side, and in other words the mirror ratio is smaller than one. Therefore, the node N8 is supplied with a smaller current than in the case without the PMOS transistor 121w, and the potential of the node N8 falls more quickly than in the case without the PMOS transistor 121w.

Moreover, the PMOS transistors 121l and 121n are in the ON state, and the node N14 is supplied with a current. Therefore, the NMOS transistors 121p, 121q, 121A, and 121B are in the ON state. As a result, the node N8 is coupled to the ground via two parallel-coupled NMOS transistors 121q and 121C, whereas the node N14 is coupled to the ground via one NMOS transistor 121p. For this reason, the combined current drivability of the NMOS transistors 121q and 121C at the mirrored side is higher than the current drivability of the NMOS transistor 121p at the to-be-mirrored side, and in other words the mirror ratio is larger than one. Therefore, a smaller current flows from the node N8 into the ground than in the case without the NMOS transistor 121C, and the potential of the node N8 falls more quickly than in the case without the NMOS transistor 121C.

The operation from the time TC5 to the time TC7 is an operation for bringing the signal OUT to the L level. As described above, the node N8 is pulled with a current via a plurality of transistors. However, between the time TC5 and the time TC7, the potential of the node N8 has not been sufficiently decreased yet, so the signal OUT is at the H level.

At time TC6, the potential of the node N8 decreases sufficiently, and the signal OUT falls from the H level to the L level.

At time TC7, the signal OUTb rises from the L level to the H level.

[Time TC8 Onward]

The amplifier performs the same operation as the one performed at the time TC0.

<3-2-2> Operation for Generating Data Strobe Signal

As described above, the amplifier changes the level of the signal OUT to the H level or the L level based on the signals AIN and BIN. The second to fourth amplifiers 122-124 also perform the same operation as that of the first amplifier 121, as in the first embodiment. This allows proper data strobe signal DQS and BDQS to be generated, as in the first embodiment. As a result, the memory chip 100 can properly transmit data to the memory controller 200.

<3-3> Advantages

According to the above-described embodiment, the amplifier includes the PMOS transistors 121w, 121x, 121y, and 121z, and the NMOS transistors 121A, 121B, 121C, and 121D. When the node N8 is charged to the H level, the PMOS transistor 121y is coupled to the PMOS transistor 121c in parallel, and the NMOS transistor 121A is coupled to the NMOS transistor 121p in parallel. For this reason, a larger current is supplied to the node N8 than in the case without the PMOS transistor 121y, and a smaller part of the current which flows into the node N8 flows into the ground than in the case without the NMOS transistor 121A. Therefore, the node N8 is charged quickly.

In contrast, when the node N8 is discharged to the L level, the PMOS transistor 121w is coupled to the PMOS transistor 121b in parallel, and the NMOS transistor 121C is coupled to the NMOS transistor 121q in parallel. For this reason, a smaller current flows from the node N8 into the ground than in the case without the NMOS transistor 121C, and a larger current is supplied to the node N8 from a node applied with the power supply voltage Vdd than in the case without the PMOS transistor 121w. Therefore, the node N8 is quickly discharged.

Thus, the node N8 is charged and discharged quickly. As a result, a proper signal OUT can be generated even when the amplifier is operated at high speed, as in the first embodiment.

<4> Fourth Embodiment

The fourth embodiment will be described. In the fourth embodiment, the description will be given of a modification of the amplifier. The basic configuration and operation of the memory device according to the fourth embodiment are the same as those of the memory device according to the first embodiment. Thus, descriptions of matters described in the first embodiment and matters easily inferable from the first embodiment will be omitted.

<4-1> Basic Configuration of Amplifier

Figure 12:
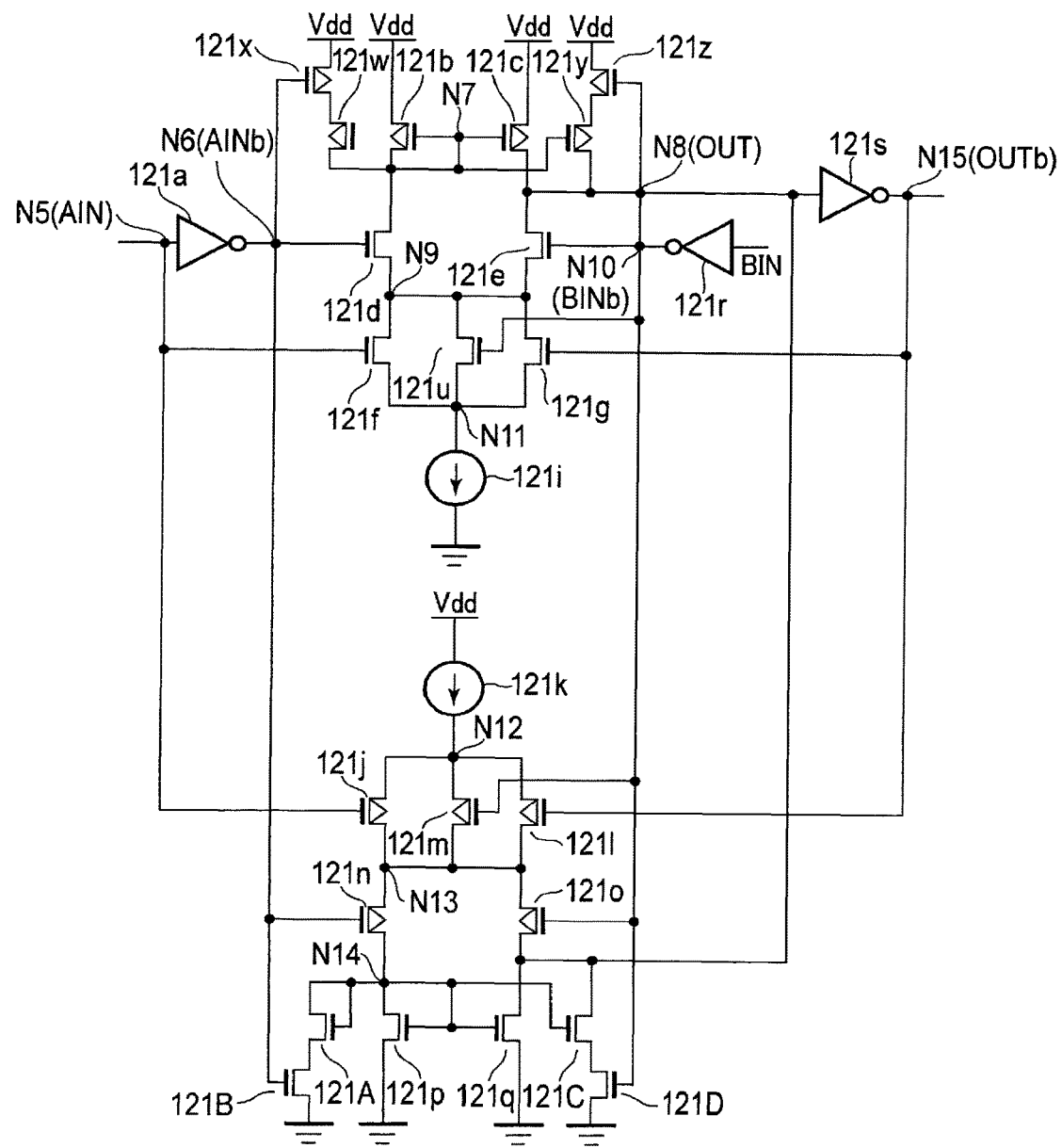
FIG. 12 is a circuit diagram showing a basic configuration of an amplifier according to a fourth embodiment.

One of the first to fourth amplifiers 121-124 will be described with reference to FIG. 12. The amplifier has a configuration which is a combination of configuration of the first embodiment and that of the third embodiment. Specifically, as shown in FIG. 12, the amplifier includes the inverters 121a, 121r, and 121s, the PMOS transistors 121b, 121c, 121j, 121l, 121m, 121n, 121o, 121w, 121x, 121y, and 121z, the NMOS transistors 121d, 121e, 121f, 121g, 121h, 121p, 121q, 121A, 121B, 121C, and 121D, and the constant current sources 121i and 121k.

<4-2> Operation

<4-2-1> Operation for Generating Signal OUT

Figure 13:
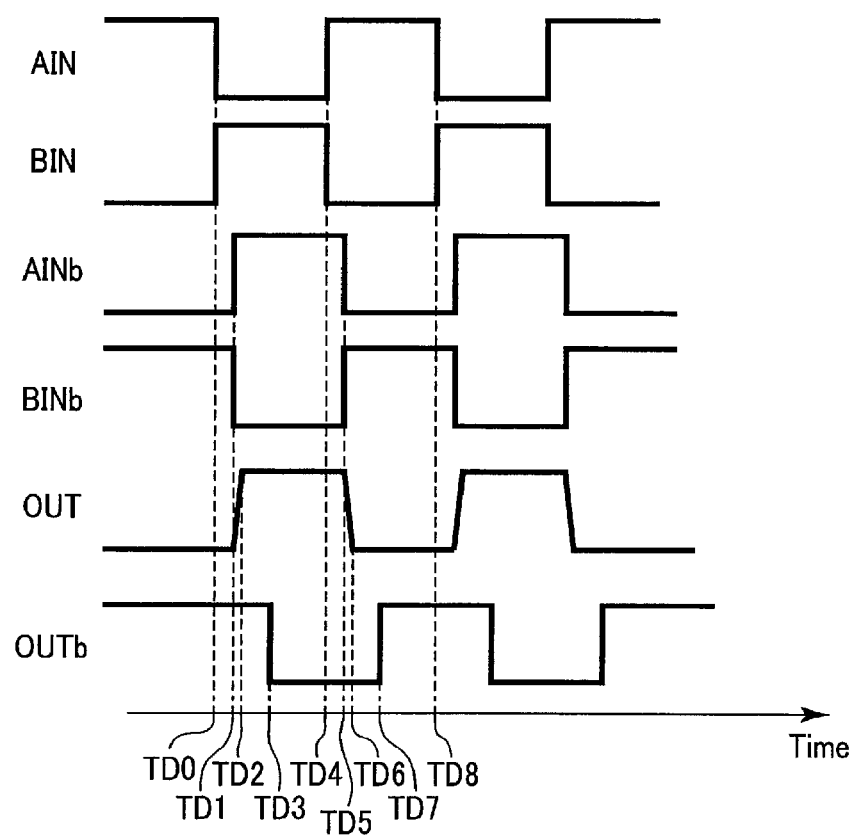
FIG. 13 is a waveform chart showing an operation of the amplifier according to the fourth embodiment.

An operation for generating the signal OUT by the amplifier will be described with reference to FIGS. 12 and 13. For simplification, an operation for generating the signal OUT by the first amplifier 121 will be described. The operation basically corresponds to the combination of the operation of the first embodiment and that of the third embodiment.

[Time TD0 to Time TD1]

As in between the time TA0 and the time TA1 of the first embodiment, the node N8 is coupled to the ground via the NMOS transistors 121e and 121g, and the constant current source 121i.

In addition, as in between the time TC0 and the time TC1 of the third embodiment, the PMOS transistor 121x and the NMOS transistor 121D are in the ON state. The node N14 is supplied with a current via the constant current source 121k, and the PMOS transistor 121j and 121n. As a result, when the node N14 transitions to the H level, the NMOS transistors 121p, 121q, 121A, and 121C are in the ON state, as in the third embodiment. This results in the node N8 coupled to the ground via the NMOS transistor 121q and coupled to the ground via the NMOS transistors 121C and 121D.

[Time TD1 to Time TD4]

As in between the time TA1 and the time TA2 of the first embodiment, the node N7 is coupled to the ground via the NMOS transistors 121d, 121g, and 121h, and the constant current source 121i. Therefore, as in between the time TC1 and the time TC2 of the third embodiment, the PMOS transistors 121b, 121c, 121w, and 121y are in the ON state, the PMOS transistor 121x and the NMOS transistor 121D are in the OFF state, and the PMOS transistors 121z and 121B are in the ON state. As a result, as in between the time TC1 and the time TC2 of the third embodiment, the node N8 is coupled to a node applied with the power supply voltage Vdd via two parallel-coupled PMOS transistors 121c and 121y, whereas the node N7 is coupled to a node applied with the power supply voltage Vdd via one PMOS transistor 121b. For this reason, as in between the time TC1 and the time TC2 of the third embodiment, the potential of the node N8 rises more quickly than in the case without the PMOS transistor 121y.

Moreover, as in between the time TA1 and the time TA2 of the first embodiment, the node N8 is supplied with a current via the PMOS transistors 121j, 121m, and 121o, and the constant current source 121k. At this time, the node N8 is coupled to the ground via one NMOS transistor 121q, whereas the node N14 is coupled to the ground via two parallel-coupled NMOS transistors 121p and 121A. As a result, as in between the time TC1 and the time TC2 of the third embodiment, the potential of the node N8 rises more quickly than in the case without the NMOS transistor 121A.

The operation between a time TD1 and a time TD2 is an operation for bringing the signal OUT to the H level. As described above, the node N8 is supplied by a current by a plurality of transistors. However, at the time TD1, the potential of the node N8 has not been sufficiently increased yet, so the signal OUT is at the L level.

At the time TD2, the potential of the node N8 increases sufficiently, and the signal OUT rises from the L level to the H level. At time TD3, the signal OUTb falls from the H level to the L level.

[Time TD4 to Time TD5]

As in between the time TA4 and the time TA5 of the first embodiment, the NMOS transistors 121d and 121f are in the ON state, and the node N8 is supplied with a current via the PMOS transistor 121c. The node N8 is supplied also with a current via the constant current source 121k, and the PMOS transistors 121m, 121l, and 121o.

[Time TD5 to Time TD7]

As in between the time TA5 and the time TA7 of the first embodiment, the node N8 is coupled to the ground via the NMOS transistors 121e, 121f, and 121h, and the constant current source 121i. Moreover, as in between the time TC5 and the time TC7 of the third embodiment, the PMOS transistor 121x and the NMOS transistor 121D are in the ON state, and the PMOS transistor 121z and the NMOS transistor 121B are in the OFF state. As a result, the node N8 is coupled to a node applied with the power supply voltage Vdd via one PMOS transistor 121c, whereas the node N7 is coupled to a node applied with the power supply voltage Vdd via two parallel-coupled PMOS transistors 121b and 121w, as in the time TC5 to the time TC7 of the third embodiment. For this reason, the potential of the node N8 falls more quickly than in the case without the PMOS transistor 121w.

Moreover, as in between the time TA5 and the time TA7 of the first embodiment, the node N14 is supplied with a current via the constant current source 121k, and the PMOS transistors 121l and 121n. As a result, the node N8 is coupled to the ground via two parallel-coupled NMOS transistors 121q and 121C, whereas the node N14 is coupled to the ground via one NMOS transistor 121p. For this reason, as in between the time TC5 and the time TC7 of the third embodiment, the potential of the node N8 falls more quickly than in the case without the NMOS transistor 121C.

The operation between time TD5 and time TD7 is an operation for bringing the signal OUT to the L level. As described above, the node N8 is supplied with a current by a plurality of transistors. However, between the time TD5 and the time TD7, the potential of the node N8 has not been sufficiently decreased yet, so the signal OUT is at the H level.

At time TD6, the potential of the node N8 decreases sufficiently, and the signal OUT falls from the H level to the L level. At the time TD7, the signal OUTb rises from the H level to the L level.

[Time TD8 Onward]

The amplifier performs the same operation as the one performed at the time TD0.

<4-2-2> Operation for Generating Data Strobe Signal

As described above, the amplifier changes the level of the signal OUT to the H level or the L level based on the signals AIN and BIN. The second to fourth amplifiers 122-124 also perform the same operation as that of the first amplifier 121, as in the first embodiment. This allows proper data strobe signal DQS and BDQS to be generated, as in the first embodiment. As a result, the memory chip 100 can properly transmit data to the memory controller 200.

<4-3> Advantages

According to the above-described embodiment, the amplifier includes the NMOS transistor 121h and the PMOS transistor 121m, as in the first embodiment. For this reason, through charging and discharging the node N8 via the NMOS transistor 121h and PMOS transistor 121m, a proper signal OUT can be generated even when the amplifier is operated at high speed, as in the first embodiment.

The amplifier further includes the PMOS transistors 121w, 121x, 121y, and 121z, and the NMOS transistors 121A, 121B, 121C, and 121D, as in the third embodiment. For this reason, through exclusive coupling of the PMOS transistors 121y and 121w and exclusive coupling of the NMOS transistors 121A and 121C, the node N8 is charged and discharged at higher speed, as in the third embodiment.

The combination of the PMOS transistors 121m, 121w, 121x, 121y, and 121z and the NMOS transistors 121h, 121A, 121B, 121C, and 121D of the first and third embodiments allows for steeper rise and fall of the signal OUT than in the case of use of only the first or third embodiment. This can secure a longer period for which the signal OUT remains at the L level or the H level, and enables higher speed operation of the amplifier. Therefore, the clock generator 120 can generate proper data strobe signals DQS and BDQS even when it operates at high speed.

<5> Fifth Embodiment

The fifth embodiment will be described. In the fifth embodiment, the description will be given of a modification of the amplifier. The basic configuration and operation of the memory device according to the fifth embodiment are the same as those of the memory device according to the first embodiment. Thus, descriptions of matters described in the first embodiment and matters easily inferable from the first embodiment will be omitted.

<5-1> Basic Configuration of Amplifier

One of the first to fourth amplifiers 121-124 will be described with reference to FIG. 14. The amplifier has a configuration which is a combination of configuration of the second embodiment and that of the third embodiment. Specifically, as shown in FIG. 14, the amplifier includes the inverters 121a, 121r, 121s, and 121t, the PMOS transistors 121b, 121c, 121j, 121l, 121n, 121o, 121v, 121w, 121x, 121y, and 121z, the NMOS transistors 121d, 121e, 121f, 121g, 121p, 121q, 121u, 121A, 121B, 121C, and 121D, and the constant current sources 121i and 121k.

<5-2> Operation

<5-2-1> Operation for Generating Signal OUT

An operation for generating the signal OUT by the amplifier will be described with reference to FIGS. 14 and 15. For simplification, an operation for generating the signal OUT by the first amplifier 121 will be described. The operation basically corresponds to the combination of the operation of the second embodiment and that of the third embodiment.

[Time TE0 to Time TE1]

As in between the time TB0 and the time TB1 of the second embodiment, the node N7 is coupled to the ground via the NMOS transistors 121e, 121g, and 121u, and the constant current source 121i.

In addition, as in between the time TC0 and the time TC1 of the third embodiment, the PMOS transistor 121x and the NMOS transistor 121D are in the ON state. The node N14 is supplied with a current via the constant current source 121k, and the PMOS transistor 121j and 121n. As a result, when the node N14 transitions to the H level, the NMOS transistors 121p, 121q, 121A, and 121C are in the ON state, as in the third embodiment. This results in the node N8 coupled to the ground via the NMOS transistor 121q and coupled to the ground via the NMOS transistors 121C and 121D.

As described, the node N8 is coupled to a node coupled to the ground by a plurality of transistors. This maintains the signal OUT at the L level even when an operation is performed at high speed (the frequency of the input signal is high).

[Time TE1 to Time TE2]

As in between the time TB1 and the time TB2 of the second embodiment, the node N7 is coupled to the ground via the NMOS transistors 121d, 121g, and 121u, and the constant current source 121i. Therefore, as in between the time TC1 and the time TC2 of the third embodiment, the PMOS transistors 121b, 121c, 121w, and 121y are in the ON state, the PMOS transistor 121x and the NMOS transistor 121D are in the OFF state, and the PMOS transistors 121z and 121B are in the ON state. As a result, as in between the time TC1 and the time TC2 of the third embodiment, the node N8 is coupled to a node applied with the power supply voltage Vdd via two parallel-coupled PMOS transistors 121c and 121y, whereas the node N7 is coupled to a node applied with the power supply voltage Vdd via one PMOS transistor 121b. For this reason, as in between the time TC1 and the time TC2 of the third embodiment, the potential of the node N8 rises more quickly than in the case without the PMOS transistor 121y.

Moreover, as in between the time TB1 and the time TB2 of the second embodiment, the node N8 is supplied with a current via the PMOS transistors 121j and 121o, and the constant current source 121k. At this time, the node N8 is coupled to the ground via one NMOS transistor 121q, whereas the node N14 is coupled to the ground via two parallel-coupled NMOS transistors 121p and 121A. As a result, as in between the time TC1 and the time TC2 of the third embodiment, the potential of the node N8 rises more quickly than in the case without the NMOS transistor 121A.

The operation between time TE1 and time TE2 is an operation for bringing the signal OUT to the H level. As described above, the node N8 is supplied with a current by a plurality of transistors. However, at the time TE1, the potential of the node N8 has not been sufficiently increased yet, so the signal OUT is at the L level.

[Time TE2 to Time TE5]

As in between the time TB2 and the time TB3 of the second embodiment, the PMOS transistor 121v is in the ON state, and the node N8 is supplied with an additional current via the PMOS transistors 121v, 121j, and 121o, and the constant current source 121k.

The operation between the time TE2 and time TE3 is an operation for bringing the signal OUT to the H level. However, at the time TE2, the potential of the node N has not been sufficiently increased yet, so the signal OUT is at the L level.

At the time TE3, when the potential of the node N8 increases sufficiently, the signal OUT rise from the L level to the H level. At time TE4, the signal OUTb falls from the H level to the L level.

[Time TE5 to Time TE6]

As in between the time TB5 to the time TB6 of the second embodiment, the node N7 is coupled to the ground via the NMOS transistors 121$d$ and 121$f$, and the constant current source 121$i$, and, thereby, the node N8 is supplied with a current via the PMOS transistors 121$c$ and 121$y$. Moreover, as in between the time TB5 and the time TB6 of the second embodiment, the node N8 is supplied with a current via the constant current source 121$k$, and the PMOS transistors 121$v$, 121$l$, and 121$o$.

[Time TE6 to Time TE7]

As in between the time TB6 and the TB7 of the second embodiment, the node N8 is coupled to the ground via the NMOS transistors 121$e$ and 121$f$, and the constant current source 121$i$. Moreover, as in between the time TC5 and the time TC7 of the third embodiment, the PMOS transistor 121$x$ and the NMOS transistor 121D are in the ON state, and the PMOS transistor 121$z$ and the NMOS transistor 121B are in the OFF state. As a result, the node N8 is coupled to a node applied with the power supply voltage Vdd via one PMOS transistor 121$c$, whereas the node N7 is coupled to a node applied with the power supply voltage Vdd via two parallel-coupled PMOS transistors 121$b$ and 121$w$, as in the time TC5 to the time TC7 of third embodiment. For this reason, the potential of the node N8 falls more quickly than in the case without the PMOS transistor 121$w$.

Moreover, as in between the time TB6 and the time TB7 of the second embodiment, the node N14 is supplied with a current via the constant current source 121$k$, the PMOS transistors 121$l$, 121$v$, and 121$n$. As a result, the node N8 is coupled to the ground via two parallel-coupled NMOS transistors 121$q$ and 121C, whereas the node N14 is coupled to the ground via one NMOS transistor 121$p$. For this reason, as in between the time TC5 and the time TC7 of the third embodiment, the potential of the node N8 falls more quickly than in the case without the NMOS transistor 121C.

The operation between time TE6 and time TE7 is an operation for bringing the signal OUT to the L level. As described above, the node N8 is supplied with a current by a plurality of transistors. However, between the time TE6 and the time TE7, the potential of the node N8 has not been sufficiently decreased yet, so the signal OUT is at the H level.

[Time TE7 to Time TE10]

As in between the time TB7 and the time TB10 of the second embodiment, the NMOS transistor 121$u$ is in the ON state, and the node N8 is coupled to the ground via the NMOS transistors 121$e$, 121$f$, and 121$u$, and the constant current source 121$i$.

The operation between the time TE7 and time TE8 is an operation for bringing the signal OUT to the L level. However, at the time TE7, the potential of the node N8 has not been sufficiently decreased, so the signal OUT is at the H level.

At the time TE8, when the potential of the node N8 decreases sufficiently, the signal OUT falls from the H level to the L level. At time TE9, the signal OUTb rises from the L level to the H level.

[Time TE10 Onward]

The amplifier performs the same operation as the one performed at the time TE0.

<5-2-2> Operation for Generating Data Strobe Signal

As described above, the amplifier changes the level of the signal OUT to the H level or the L level based on the signals AIN and BIN. The second to fourth amplifiers 122-124 also perform the same operation as that of the first amplifier 121, as in the first embodiment. This allows proper data strobe signal DQS and BDQS to be generated, as in the first embodiment. As a result, the memory chip 100 can properly transmit data to the memory controller 200.

<5-3> Advantages

According to the above-described embodiment, the amplifier includes the NMOS transistor 121$u$ and the PMOS transistor 121$v$ operated by the signal AINs, as in the second embodiment. For this reason, the node N8 can be set to a desirable potential more reliably than in the first embodiment.

The amplifier further includes the PMOS transistors 121$w$, 121$x$, 121$y$, and 121$z$, and the NMOS transistors 121A, 121B, 121C, and 121D, as in the third embodiment. For this reason, through exclusive coupling of the PMOS transistors 121$y$ and 121$w$ and exclusive coupling of the NMOS transistors 121A and 121C, the node N8 is charged and discharged at higher speed, as in the third embodiment.

The combination of the PMOS transistors 121$v$, 121$w$, 121$x$, 121$y$, and 121$z$ and the NMOS transistors 121$u$, 121A, 121B, 121C, and 121D of the second and third embodiments allows for steeper rise and fall of the signal OUT than in the case of use of only the second or third embodiment. This can secure a longer period for which the signal OUT remains at the L level or the H level, and enables higher speed operation of the amplifier. Therefore, the clock generator 120 can generate proper data strobe signals DQS and BDQS even when it operates at high speed.

In each of the above-described embodiments, the input/output control circuit 103, the logic control circuit 105, and the control circuit 106 are described as separate components, but are not necessarily separate components. For example, the input/output control circuit 103, the logic control circuit 105, and the control circuit 106 may be realized in the same hardware.

Additionally, in each of the above-described embodiments:

(1) In the read operation, the voltage applied to a word line selected for an A level read operation is, for example, between 0V and 0.55V. The voltage is not limited thereto, and may be any one of between 0.1V and 0.24V, between 0.21V and 0.31V, between 0.31V and 0.4V, between 0.4V to 0.5V, and between 0.5V and 0.55V.

The voltage applied to a word line selected for a B level read operation is, for example, between 1.5V and 2.3V. The voltage is not limited thereto, and may be any one of between 1.65 V and 1.8 V, between 1.8V and 1.95V, between 1.95V and 2.1V, and between 2.1V and 2.3V.

The voltage applied to a word line selected for a C level read operation is, for example, 3.0V and 4.0V. The voltage is not limited thereto, and may be any one of between 3.0V and 3.2V, between 3.2V and 3.4V, between 3.4V and 3.5V, between 3.5V and 3.6V, and between 3.6 V and 4.0V.

The time for the read operation (tR) may be, for example, between 25 μs and 38 μs, between 38 μs and 70 μs, or between 70 μs to 80 μs.

(2) As described above, the write operation includes a program operation and a verification operation. In the write operation, the voltage first applied to a word line selected for the program operation is, for example, between 13.7V and 14.3V. The voltage is not limited thereto, and may be either one of between 13.7V and 14.0V and between 14.0V and 14.6V.

The voltage first applied to a selected word line in a writing into an odd word line may differ from the voltage first applied to a selected word line in a writing into an even word line.

When the Incremental Step Pulse Program (ISPP) method is used for the program operation, the voltage may be stepped up by approximately 0.5V, for example.

The voltage applied to unselected word lines is, for example, between 7.0V and 7.3V. The voltage is not limited thereto, and may be, for example, between 7.3V and 8.4V or may be 6.0V or less.

The pass voltage to be applied may be changed depending on whether an unselected word line is an odd word line or an even word line.

The time for the write operation (tProg) may be, for example, between 1700 μs and 1800 μs, between 1800 μs and 1900 μs, or between 1900 μs to 2000 μs.

(3) In the erase operation, the voltage first applied to a well, which is formed on the semiconductor substrate and above which the memory cells are arranged, is, for example, between 12V and 13.6V. The voltage is not limited thereto, and may be, for example, between 13.6V and 14.8V, between 14.8V and 19.0V, between 19.0V and 19.8V, or between 19.8V and 21V.

The time for the erase operation (tErase) may be, for example, between 3000 μs and 4000 μs, between 4000 μs and 5000 μs, or between 4000 μs and 9000 μs.

(4) The structure of the memory cell includes a charge accumulation layer disposed on the semiconductor substrate (silicon substrate) via a tunnel insulation film of a thickness of 4 to 10 nm. This charge accumulation layer may have a stacked structure including an insulation film of SiN or SiON of a thickness of 2 to 3 nm and polysilicon of a thickness of 3 to 8 nm. The polysilicon may include a metal such as Ru. An insulation film is provided on the charge accumulation layer. This insulation film includes, for example, a silicon oxide film of a thickness of 4 to 10 nm intervening between a lower high-k film of a thickness of 3 to 10 nm and an upper high-k film of a thickness of 3 to 10 nm. The high-k film includes, for example, HfO. The silicon oxide film can be greater in thickness than the high-k film. A control electrode of a thickness of 30 to 70 nm is formed on the insulation film with a material for work function adjustment of a thickness of 3 to 10 nm interposed therebetween. Here, the material for work function adjustment includes a metal-oxide film such as TaO or a metal-nitride film such as TaN. For example, W can be used for the control electrode.

An air gap can be formed between the memory cells.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An amplifier comprising:
   a first inverter which inverts and delays a first signal to generate a second signal;
   a second inverter which inverts and delays a third signal to generate a fourth signal, the third signal being an inverse signal of the first signal;
   a first transistor of a first conductivity type including a gate electrode supplied with the second signal;
   a second transistor of the first conductivity type including a gate electrode supplied with the fourth signal;
   an output terminal which is coupled to one terminal of the second transistor and outputs a fifth signal;
   a third inverter which inverts and delays the fifth signal to generate a sixth signal; and
   a first discharge circuit which discharges one terminal of the first transistor and the one terminal of the second transistor based on the first signal, the sixth signal, or the fourth signal, the first discharge circuit including one terminal coupled to the other terminal of each of the first and second transistors.

2. The amplifier according to claim 1, further comprising:
   a third transistor of a second conductivity type including a gate electrode supplied with the second signal, the second conductivity type differing from the first conductivity type;
   a fourth transistor of the second conductivity type including a gate electrode supplied with the fourth signal; and
   a first charge circuit which charges one terminal of each of the third and fourth transistors based on the first signal, the sixth signal, or the fourth signal, the first charge circuit including one terminal coupled to the other terminal of each of the third and fourth transistors,
   wherein the output terminal is coupled to the one terminal of the fourth transistor and outputs the fifth signal.

3. The amplifier according to claim 1, wherein:
   the first discharge circuit comprises:
      a fifth transistor of the first conductivity type which discharges the one terminal of each of the first and second transistors based on the first signal;
      a sixth transistor of the first conductivity type which discharges the one terminal of each of the first and second transistors based on the sixth signal; and
      a seventh transistor of the first conductivity type which discharges the one terminal of each of the first and second transistors based on the fourth signal.

4. The amplifier according to claim 2, wherein:
   the first charge circuit comprises:
      an eighth transistor of the second conductivity type which charges the one terminal of each of the third and fourth transistors based on the first signal;
      a ninth transistor of the second conductivity type which charges the one terminal of each of the third and fourth transistors based on the sixth signal; and
      a tenth transistor of the second conductivity type which charges the one terminal of each of the third and fourth transistors based on the fourth signal.

5. The amplifier according to claim 1, further comprising:
   a second charge circuit which charges the output terminal based on a potential of the one terminal of the first transistor.

6. The amplifier according to claim 2, further comprising:
a second discharge circuit which discharges the output terminal based on a potential of the one terminal of the third transistor.

7. The amplifier according to claim 5, wherein:
the second charge circuit comprises:
an eleventh transistor of the second conductivity type including one terminal applied with a first voltage, and the other terminal and a gate electrode coupled to the one terminal of the first transistor; and
a twelfth transistor of the second conductivity type including one terminal applied with the first voltage, and the other terminal coupled to the output terminal, and a gate electrode coupled to the other terminal of the eleventh transistor.

8. The amplifier according to claim 6, wherein:
the second discharge circuit comprises:
a thirteenth transistor of the first conductivity type including one terminal coupled to the ground, and the other terminal and a gate electrode coupled to the one terminal of the third transistor; and
a fourteenth transistor of the first conductivity type including one terminal coupled to the ground, the other terminal coupled to the output terminal, and a gate electrode coupled to the other terminal of the thirteenth transistor.

9. An amplifier comprising:
a first inverter which inverts and delays a first signal to generate a second signal;
a second inverter which inverts and delays a third signal to generate a fourth signal, the third signal being an inverse signal of the first signal;
a first transistor of a first conductivity type including a gate electrode supplied with the second signal;
a second transistor of the first conductivity type including a gate electrode supplied with the fourth signal;
an output terminal which is coupled to one terminal of the second transistor and outputs a fifth signal;
a third inverter which inverts and delays the fifth signal to generate a sixth signal; and
a fourth inverter which inverts and delays the second signal to generate a seventh signal; and
a first discharge circuit which discharges one terminal of the first transistor and the one terminal of the second transistor based on the first signal, the sixth signal, or the seventh signal, the first discharge circuit including one terminal coupled to the other terminal of each of the first and second transistors.

10. The amplifier according to claim 9, further comprising:
a third transistor of a second conductivity type including a gate electrode supplied with the second signal, the second conductivity type differing from the first conductivity type;
a fourth transistor of the second conductivity type including a gate electrode supplied with the fourth signal; and
a first charge circuit which charges one terminal of each of the third and fourth transistors based on the first signal, the sixth signal, or the seventh signal, the first charge circuit including one terminal coupled to the other terminal of each of the third and fourth transistors,
wherein the output terminal is coupled to the one terminal of the fourth transistor and outputs the fifth signal.

11. The amplifier according to claim 9, wherein:
the first discharge circuit comprises:

a fifth transistor of the first conductivity type which discharges the one terminal of each of the first and second transistors based on the first signal;
a sixth transistor of the first conductivity type which discharges the one terminal of each of the first and second transistors based on the sixth signal; and
a seventh transistor of the first conductivity type which discharges the one terminal of each of the first and second transistors based on the seventh signal.

12. The amplifier according to claim 10, wherein:
the first charge circuit comprises:
an eighth transistor of the second conductivity type which charges the one terminal of each of the third and fourth transistors based on the first signal;
a ninth transistor of the second conductivity type which charges the one terminal of each of the third and fourth transistors based on the sixth signal; and
a tenth transistor of the second conductivity type which charges the one terminal of each of the third and fourth transistors based on the seventh signal.

13. The amplifier according to claim 9, further comprising:
a second charge circuit which charges the output terminal based on a potential of the one terminal of the first transistor.

14. The amplifier according to claim 10, further comprising:
a second discharge circuit which discharges the output terminal based on a potential of the one terminal of the third transistor.

15. The amplifier according to claim 11, wherein:
the second charge circuit comprises:
an eleventh transistor of the second conductivity type including one terminal applied with a first voltage, and the other terminal and a gate electrode coupled to the one terminal of the first transistor; and
a twelfth transistor of the second conductivity type including one terminal applied with the first voltage, and the other terminal coupled to the output terminal, and a gate electrode coupled to the other terminal of the eleventh transistor.

16. The amplifier according to claim 12, wherein
the second discharge circuit comprises:
a thirteenth transistor of the first conductivity type including one terminal coupled to the ground, and the other terminal and a gate electrode coupled to the one terminal of the third transistor; and
a fourteenth transistor of the first conductivity type including one terminal coupled to the ground, the other terminal coupled to the output terminal, and a gate electrode coupled to the other terminal of the thirteenth transistor.

17. An amplifier comprising:
a first inverter which inverts and delays a first signal to generate a second signal;
a second inverter which inverts and delays a third signal to generate a fourth signal, the third signal being an inverse signal of the first signal;
a first transistor of a first conductivity type including a gate electrode supplied with the second signal;
a second transistor of the first conductivity type including a gate electrode supplied with the fourth signal;
an output terminal which is coupled to one terminal of the second transistor and outputs a fifth signal;
a third inverter which inverts and delays the fifth signal to generate a sixth signal;

a first discharge circuit which discharges one terminal of the first transistor and the one terminal of the second transistor based on the first signal or the sixth signal, the first discharge circuit including one terminal coupled to the other terminal of each of the first and second transistors; and a first charge circuit which charges the output terminal with a first current with a variable ratio between the first current and a second current flowing through the one terminal of the first transistor.

18. The amplifier according to claim 17, further comprising:

a third transistor of a second conductivity type including a gate electrode supplied with the second signal, the second conductivity type differing from the first conductivity type;

a fourth transistor of the second conductivity type including a gate electrode supplied with the fourth signal;

a second charge circuit which charges one terminal of each of the third and fourth transistors based on the first signal or the sixth signal, the second charge circuit including one terminal coupled to the other terminal of each of the third and fourth transistors;

a second discharge circuit which discharges the output terminal with a third current with a variable ratio between the third current and a fourth current flowing through the one terminal of the third transistor, wherein the output terminal is coupled to the one terminal of the fourth transistor and outputs the fifth signal.

19. The amplifier according to claim 17, wherein:

the first charge circuit comprises:

a fifth transistor of the second conductivity type including one terminal applied with a first voltage, and the other terminal and a gate electrode coupled to the one terminal of the first transistor;

a sixth transistor of the second conductivity type including one terminal applied with the first voltage, and the other terminal coupled to the output terminal, and a gate electrode coupled to the other terminal of the fifth transistor;

a seventh transistor of the second conductivity type including one terminal applied with the first voltage, and a gate electrode supplied with the second signal;

an eighth transistor of the second conductivity type including one terminal coupled to the other terminal of the seventh transistor, and the other terminal and a gate electrode coupled to the one terminal of the first transistor;

a ninth transistor of the second conductivity type including one terminal applied with the first voltage, and a gate electrode supplied with the fourth signal;

a tenth transistor of the second conductivity type including one terminal coupled to the other terminal of the ninth transistor, the other terminal coupled to the output terminal, and a gate electrode coupled to the one terminal of the first transistor.

20. The amplifier according to claim 18, wherein:

the second discharge circuit comprises:

an eleventh transistor of the first conductivity type including one terminal coupled to the ground, and the other terminal and a gate electrode coupled to the one terminal of the third transistor;

a twelfth transistor of the first conductivity type including one terminal coupled to the ground, and the other terminal coupled to the output terminal, and a gate electrode coupled to the other terminal of the eleventh transistor;

a thirteenth transistor of the first conductivity type including one terminal coupled to the ground, and a gate electrode supplied with the second signal;

a fourteenth transistor of the first conductivity type including one terminal coupled to the other terminal of the thirteenth transistor, and the other terminal and a gate electrode coupled to the one terminal of the third transistor;

a fifteenth transistor of the first conductivity type including one terminal coupled to the ground, and a gate electrode supplied with the fourth signal; and a sixteenth transistor of the first conductivity type including one terminal coupled to the other terminal of the fifteenth transistor, the other terminal coupled to the output terminal, and a gate electrode coupled to the one terminal of the third transistor.

* * * * *